(12) United States Patent
Shigematsu

(10) Patent No.: US 6,259,508 B1
(45) Date of Patent: *Jul. 10, 2001

(54) PROJECTION OPTICAL SYSTEM AND EXPOSURE APPARATUS AND METHOD

(75) Inventor: Koji Shigematsu, Kawasaki (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,969

(22) Filed: Jan. 21, 1999

(30) Foreign Application Priority Data

Jan. 22, 1998 (JP) .................................................. 10-024043

(51) Int. Cl.⁷ .......................... G03B 27/42; G03B 27/54; G02B 9/60
(52) U.S. Cl. ................................ 355/53; 355/67; 359/766
(58) Field of Search ................................. 355/53, 55, 67, 355/77; 359/683, 759, 765, 766

(56) References Cited

U.S. PATENT DOCUMENTS

| | | | |
|---|---|---|---|
| 3,504,961 | 4/1970 | Hoogland et al. | 350/214 |
| 3,897,138 | 7/1975 | Kano | 350/183 |
| 3,909,115 | 9/1975 | Kano | 350/214 |

(List continued on next page.)

FOREIGN PATENT DOCUMENTS

| | | |
|---|---|---|
| 712019A2 | 5/1996 | (EP) . |
| 717299A1 | 6/1996 | (EP) . |
| 721150A2 | 7/1996 | (EP) . |
| 0732605A2 | 9/1996 | (EP) . |
| 732605A2 | 9/1996 | (EP) . |
| 733605A1 | 9/1996 | (EP) . |
| 770895A2 | 5/1997 | (EP) . |
| 803755A2 | 10/1997 | (EP) . |
| 0 828 172 | 3/1998 | (EP) . |
| 55-12902 | 1/1980 | (JP) . |
| 63-118115 | 5/1988 | (JP) . |

(List continued on next page.)

OTHER PUBLICATIONS

"Quality of Microlithographic Projection Lenses" by J. Braat, SPIE Proceedings, vol. 811, Optical Microlithographic Technology for Integrated Circuit Fabrication and Inspection, H. Stover, S. Wittekoek, Eds., pp. 22–30 (Apr. 1987).

Primary Examiner—Russell Adams
Assistant Examiner—Hung Henry Nguyen
(74) Attorney, Agent, or Firm—Oliff & Berridge PLC

(57) ABSTRACT

A projection optical system (20), exposure apparatus (10) incorporating same, and methods pertaining to same, for manufacturing devices and elements, such as integrated circuits, crystal displays, detectors, MR (magneto-resistive) heads, and the like. The projection optical system includes a first lens group (G1) having positive refractive power, a second lens group (G2) having negative refractive power, a third lens group (G3) having positive refractive power, a fourth lens group (G4) having negative refractive power and a least a first aspherical surface (ASP1), and a fifth lens group (G5) having positive refractive power and an aperture stop (AS). The projection optical system is designed such that paraxial rays traveling parallel to optical axis (A) imagewise to objectwise intersect the optical axis at a location (Q) between the fourth lens group and the fifth lens group. Further, one of the fourth and fifth lens groups includes at least a second aspherical surface (ASP2) arranged between the first aspherical surface in the fourth lens group and the aperture stop. Also, the fifth lens group includes at least a third aspherical surface (ASP3) arranged imagewise of the aperture stop. The projection optical system also satisfies at least one of a number of design conditions.

29 Claims, 14 Drawing Sheets

U.S. PATENT DOCUMENTS

| | | | |
|---|---|---|---|
| 4,619,508 | 10/1986 | Shibuya et al. | 353/122 |
| 4,666,273 | 5/1987 | Shimizu | 353/101 |
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,851,978 | 7/1989 | Ichihara | 362/268 |
| 4,891,663 | 1/1990 | Hirose | 355/53 |
| 4,931,830 | 6/1990 | Suwa et al. | 355/71 |
| 4,939,630 | 7/1990 | Kikuchi et al. | 362/268 |
| 4,948,238 | 8/1990 | Araki et al. | 350/469 |
| 5,105,075 | 4/1992 | Ohta | 250/201.2 |
| 5,170,207 | 12/1992 | Tezuka et al. | 355/53 |
| 5,172,275 | 12/1992 | DeJager | 349/755 |
| 5,237,367 | 8/1993 | Kudo | 355/67 |
| 5,260,832 | 11/1993 | Togino et al. | 359/679 |
| 5,307,207 | 4/1994 | Ichihara | 359/622 |
| 5,392,094 | 2/1995 | Kudo | 355/67 |
| 5,437,946 | 8/1995 | McCoy | 430/5 |
| 5,473,410 | 12/1995 | Nishi | 355/53 |
| 5,477,304 | 12/1995 | Nishi | 355/53 |
| 5,555,479 | 9/1996 | Nakagiri | 359/355 |
| 5,617,182 | 4/1997 | Wakamoto et al. | 355/53 |
| 5,623,365 | 4/1997 | Kuba | 359/569 |
| 5,636,000 | 6/1997 | Ushida et al. | 355/30 |
| 5,717,518 | 2/1998 | Shafer et al. | 359/357 |
| 5,781,278 | 7/1998 | Matsuzawa et al. | 355/53 |
| 5,805,344 | 9/1998 | Sasaya et al. | 359/649 |
| 5,808,814 | 9/1998 | Kudo | 359/754 |
| 5,831,770 | 11/1998 | Mutsuzawa et al. | 359/649 |
| 5,831,776 | 11/1998 | Sasaya et al. | 359/754 |
| 5,835,285 | 11/1998 | Matsuzawa et al. | 359/754 |
| 5,856,883 | 1/1999 | Sander | 358/389 |
| 5,856,884 | 1/1999 | Mercado | 359/649 |
| 5,903,400 | 5/1999 | Endo | 359/758 |
| 5,920,379 * | 7/1999 | Matsuyama | 355/67 |
| 5,930,049 * | 7/1999 | Suenaga et al. | 359/650 |
| 5,943,172 | 8/1999 | Sasaya et al. | 359/754 |
| 5,956,182 | 9/1999 | Takahashi | 359/649 |
| 5,990,926 * | 11/1999 | Mercado | 347/258 |
| 6,008,884 | 12/1999 | Yamaguchi et al. | 355/53 |
| 6,084,723 | 7/2000 | Matsuzawa et al. | 359/754 |
| 6,088,171 | 7/2000 | Kudo | 359/754 |
| 6,104,544 | 8/2000 | Matsuzawa et al. | 359/649 |

FOREIGN PATENT DOCUMENTS

| | | |
|---|---|---|
| 5034593 | 2/1993 | (JP) . |
| 5173065 | 7/1993 | (JP) . |
| 6313845 | 11/1994 | (JP) . |
| 07128592 | 5/1995 | (JP) . |
| 7128592 | 5/1995 | (JP) . |
| 7140385 | 6/1995 | (JP) . |

\* cited by examiner

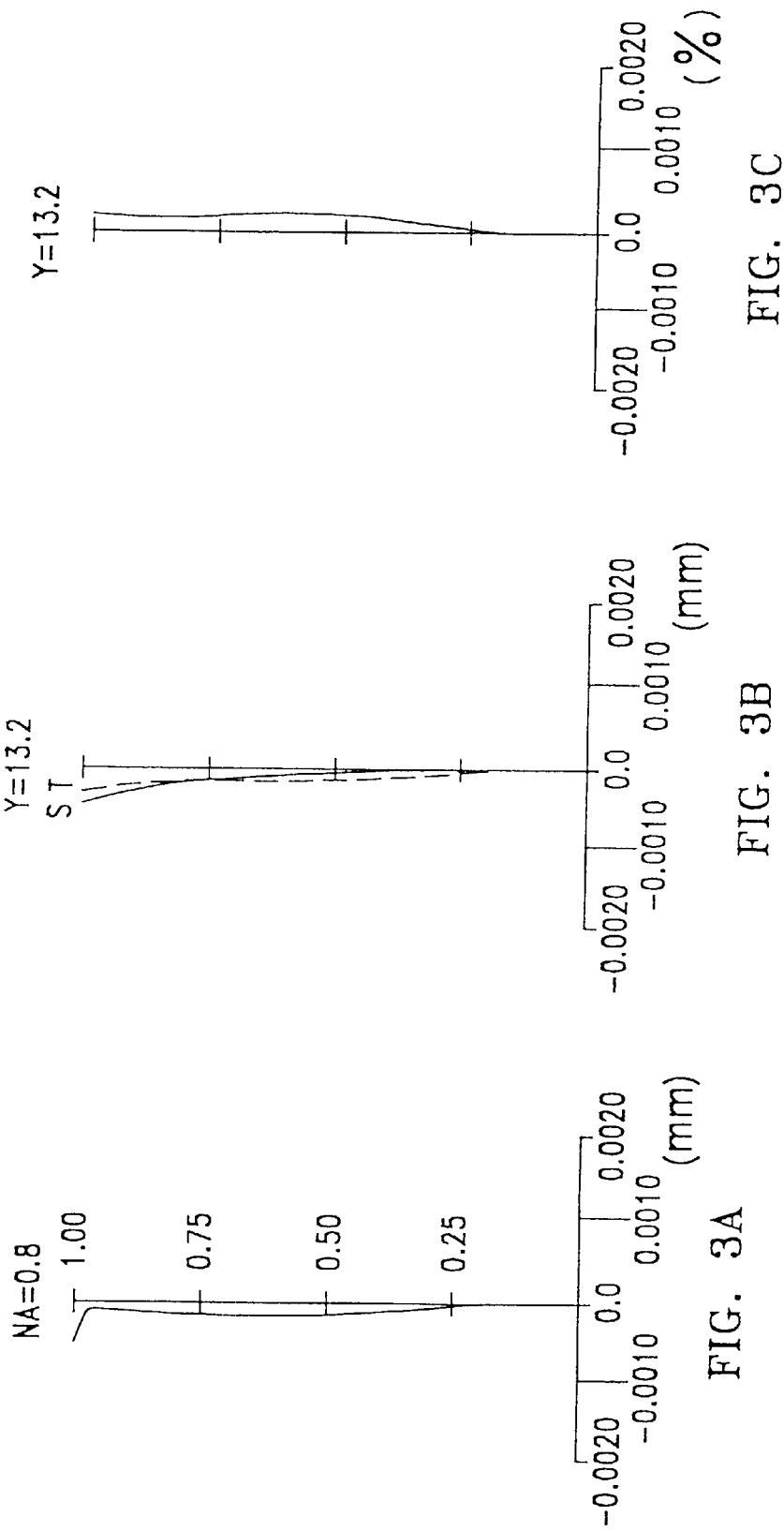

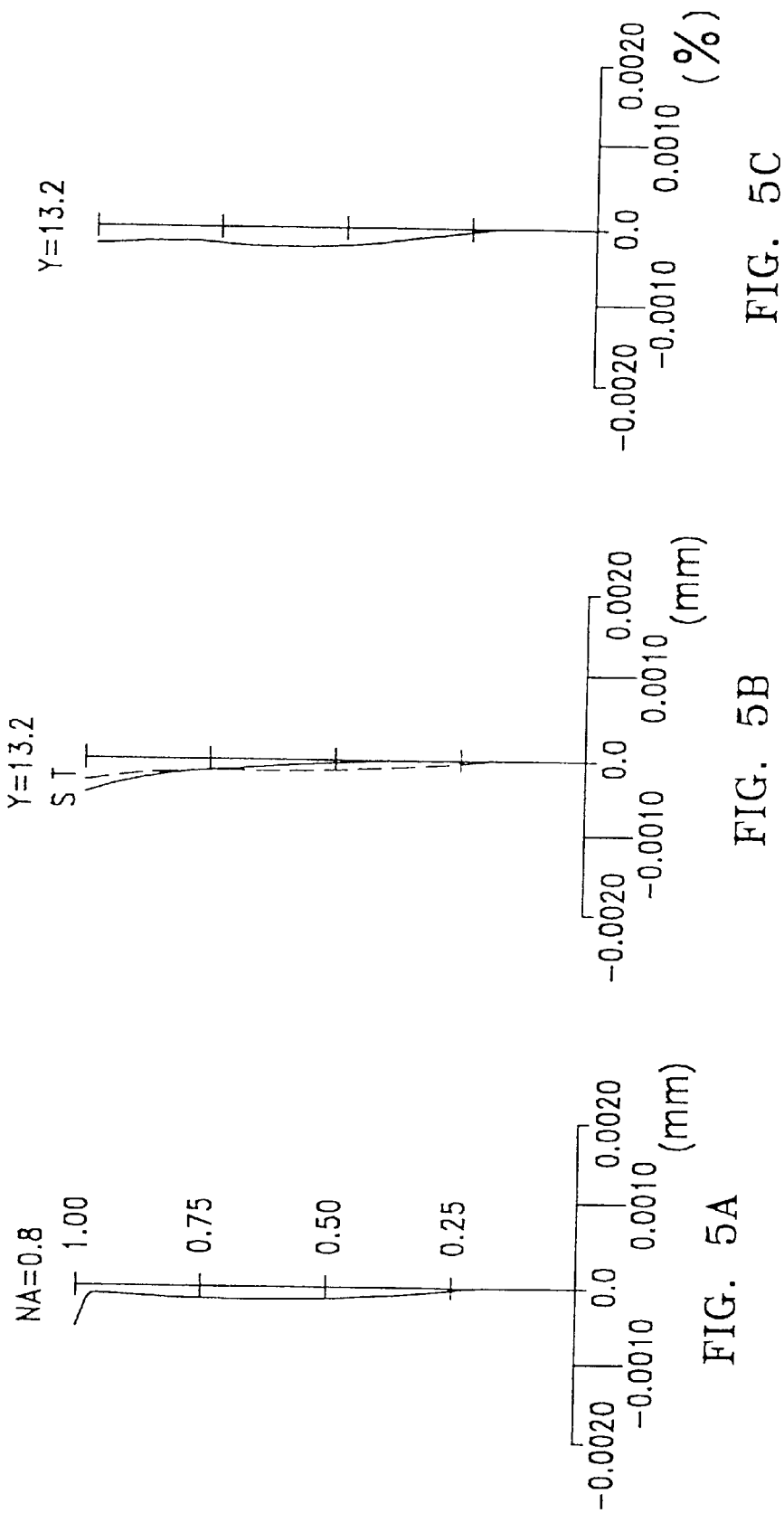

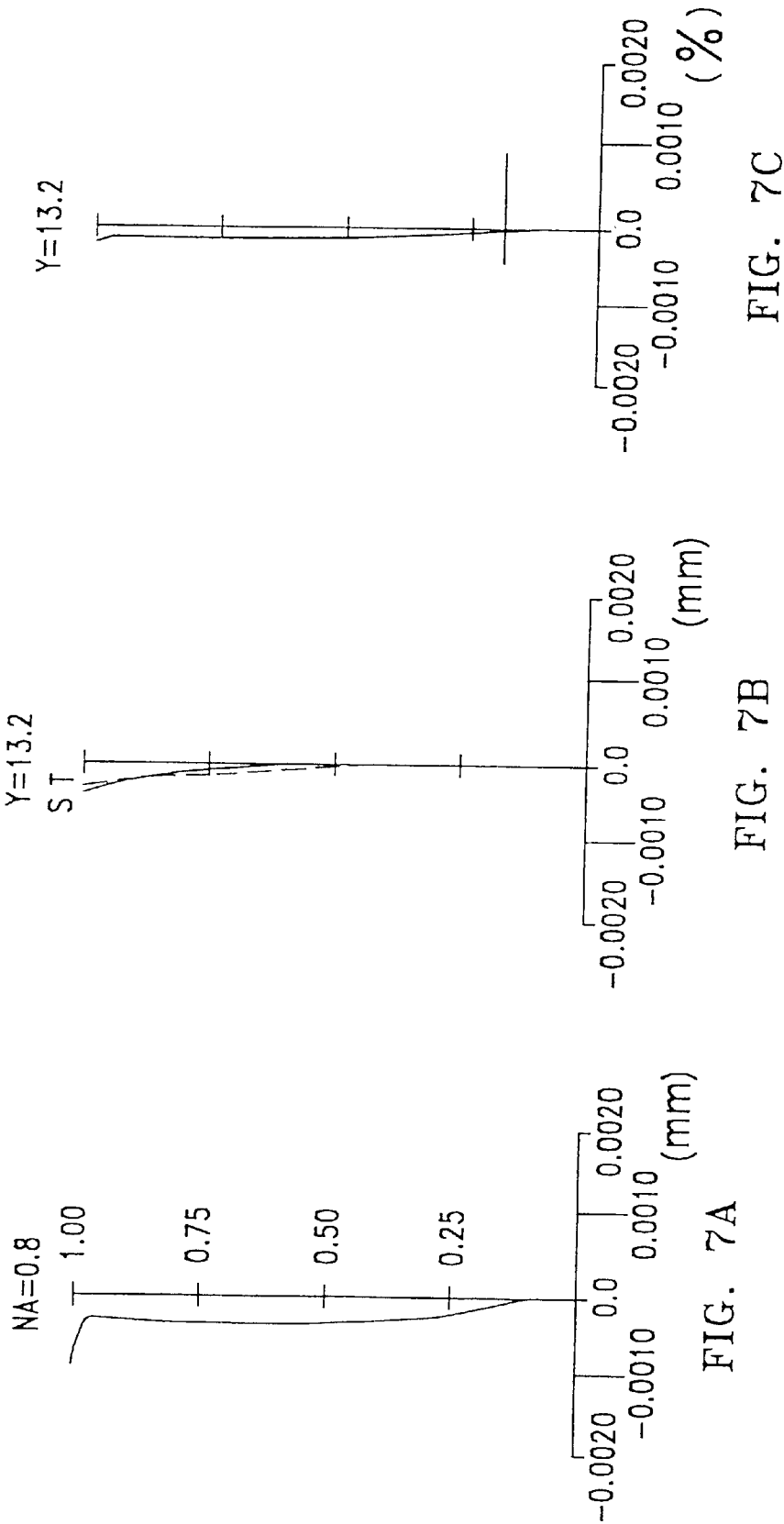

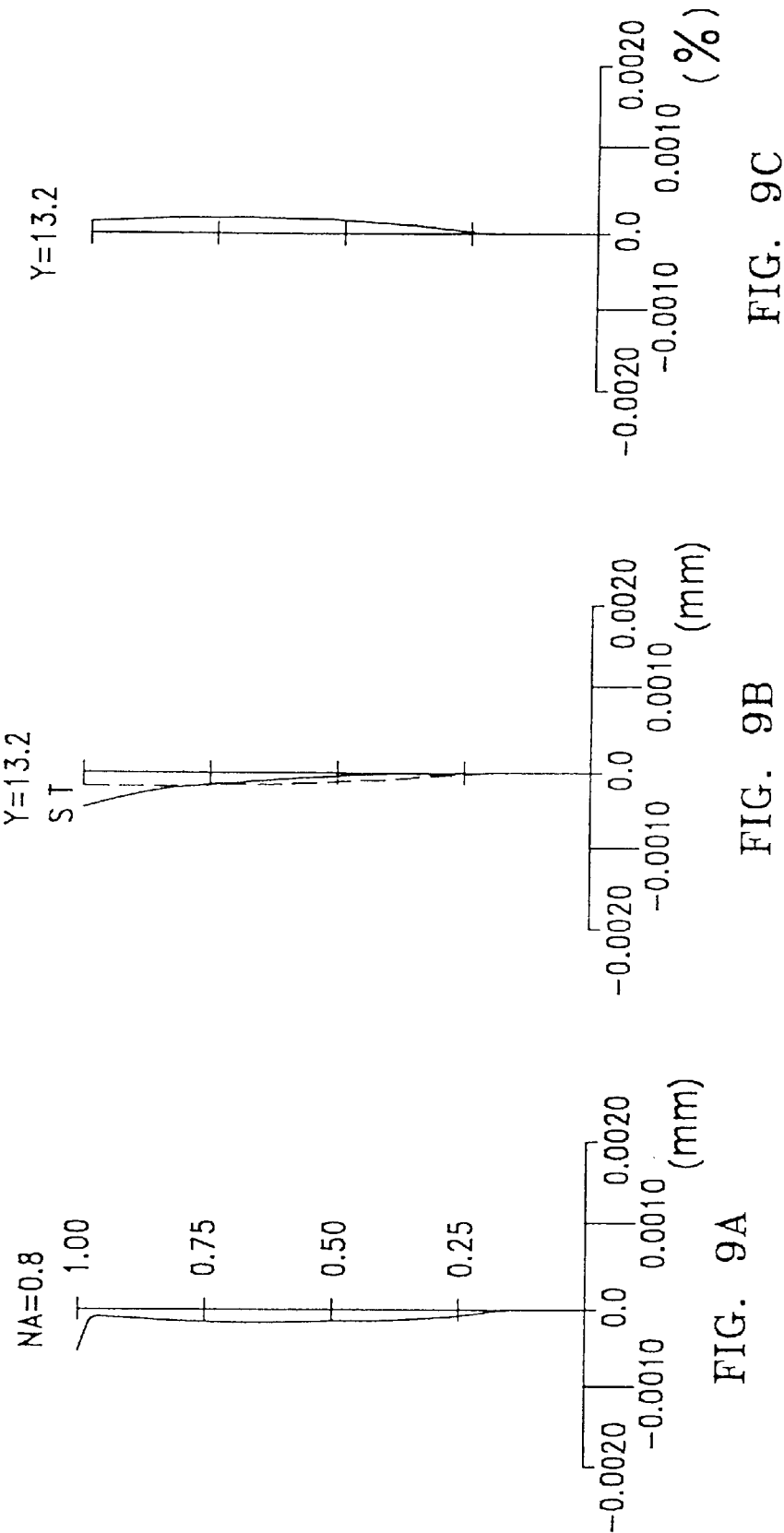

PROJECTION OPTICAL SYSTEM AND EXPOSURE APPARATUS AND METHOD

FIELD OF THE INVENTION

The present invention relates to projection optical systems and exposure apparatus incorporating same and methods pertaining to same, and in particular to such systems, apparatus and methods for manufacturing devices and elements, such as integrated circuits, liquid crystal displays, detectors, MR (magneto-resistive) heads, and the like.

BACKGROUND OF THE INVENTION

Step-and-repeat and step-and-scan projection exposure apparatus are presently used to manufacture semiconductor devices and the like. In step and repeat projection exposure apparatus ("steppers"), each exposure field is exposed in a single static exposure. In step-and-scan projection exposure apparatus ("scanners"), each exposure field is scanned during exposure. A projection exposure apparatus as used in semiconductor manufacturing, for example, transfers an image of a pattern on a reticle, which is used as a mask, through a projection optical system and onto a wafer (or glass plate or like workpiece) coated with a photo-sensitive medium, such as photoresist. With the increasing miniaturization of the patterns of semiconductor integrated circuits and other similar devices, there is an increasing demand to increase the resolving power of projection optical systems incorporated into projection exposure apparatus. The resolving power of the projection optical system can be increased by either shortening the exposure wavelength or increasing the image-side numerical aperture (NA).

The wavelengths used in projection exposure apparatus for semiconductor manufacturing are principally mercury lamp g-line ($\lambda$=436 nm) to the i-line ($\lambda$=365 nm). More recently, efforts are being made to employ shorter wavelength light sources, for example excimer lasers ($\lambda$=248 nm, 193 nm). Consequently, projection optical systems are being developed that have optical characteristics that can be used with exposure light of short wavelength.

In addition, the demand for both increased resolving power and reduced image distortion in projection optical systems has increased. Image distortion as a whole includes several contributing factors, such as distortion inherent in the projection optical system, distortion due to warping of the wafer upon which the circuit pattern is printed, and distortion due to warping of the reticle on which the circuit pattern to be imaged resides.

To reduce the effect of image distortion due to warping of the wafer, imagewise telecentric projection optical systems have been developed. In such systems, the exit pupil is located at infinity objectwise of the projection optical system. Likewise, to reduce image distortion due to warpage of the reticle, objectwise telecentric optical systems have been employed, wherein the entrance pupil of the projection optical system is located at infinity imagewise of the projection optical system. Such projection optical systems are disclosed in, for example, Japanese Patent Application Kokai No. Sho 63-118115, U.S. Pat. No. 5,260,832 and Japanese Patent Application Kokai No. Hei 5-173065.

In addition, there have been demands for being able to select and adjust the NA to be more ideally suited for printing particular types of patterns on the reticle, as well as to account for other manufacturing conditions. In particular, there have been demands for the projection optical systems in exposure apparatus to have a variable aperture stop whose size can be varied to change the NA of the projection optical system.

Also, if a plurality of lens surfaces in the projection optical system are made aspherical, it is possible to reduce the number of lenses used. Examples of such projection optical systems are disclosed in, for example, U.S. Pat. No. 4,928,238, Japanese Patent Application Kokai No. Hei 5-34593 and Japanese Patent Application Kokai No. Hei 7-128592.

As described above, it is desirable to make the projection optical system both imagewise and objectwise telecentric (i.e., "double-telecentric") to reduce the effects of both wafer warping and reticle warping on image distortion. Therefore, as disclosed in the abovementioned patent applications, projection optical systems have been developed that are double-telecentric. Nevertheless, in prior art double-telecentric projection optical systems, it has proven difficult to make the NA sufficiently large while simultaneously reducing the various aberrations over a large exposure field. In particular, in the prior art systems, distortion correction is generally inadequate.

Moreover, in the prior art projection optical systems, if a variable aperture stop is provided to vary the NA of the projection optical system, vignetting occurs at the periphery of the exposure field due to spherical aberration at the pupil when the aperture stop size is changed. Consequently, uniformity of illumination suffers in the exposure field periphery. In addition, telecentricity degrades when the numerical aperture is varied, and there is also the problem that the exposure field size cannot be increased.

Furthermore, the projection optical systems with aspherical surfaces disclosed in the abovementioned patent applications introduce aspherical surfaces for the purpose of reducing the overall glass thickness of the optical system and of improving transmittance. However, this has not lead to projection optical systems having large exposure regions and a sufficiently large numerical apertures.

SUMMARY OF THE INVENTION

The present invention relates to projection optical systems and exposure apparatus incorporating same and methods pertaining to same, and in particular to such systems, apparatus and methods for manufacturing devices and elements, such as integrated circuits, liquid crystal displays, CCD (charge coupled device) detectors, MR (magneto-resistive) heads, and the like.

The present invention takes the above problems into consideration and has several objectives. The first objective to provide a compact high-performance projection optical system that is double-telecentric, and that includes an aperture stop capable of reducing the effects of vignetting when the numerical aperture (NA) is varied. A second objective is a projection optical system that is extremely well-corrected for the various aberrations, particularly istortion, while ensuring, through the use of aspherical lens surfaces, a sufficiently large numerical aperture and a large exposure field. A third objective to provide an exposure apparatus which includes with the abovementioned projection optical system, and a semiconductor device manufacturing method employing the exposure apparatus.

Accordingly, a first aspect of the present invention is a projection optical system capable of forming an image of an object. The system comprises, objectwise to imagewise, along an optical axis, a first lens group having positive refractive power, a second lens group having negative refractive power, a third lens group having positive refractive power, a fourth lens group having negative refractive power and a first aspherical surface, and a fifth lens group having positive refractive power and an aperture. The projection optical system is designed such that paraxial rays traveling parallel to the optical axis imagewise to objectwise intersect the optical axis at a location Q between the fourth lens group and the fifth lens group. Further, at least one of the fourth and fifth lens groups includes a second aspherical surface arranged between the first aspherical surface in the fourth lens group and the aperture stop. Also, the fifth lens group includes a third aspherical surface arranged imagewise of the aperture stop. In addition, the following condition is satisfied:

$$0.01 < d_Q/\{L \times (1-NA)\} < 0.4 \quad (1)$$

wherein the image and the object are separated by a distance L, the location Q and the aperture stop are separated by a distance $d_Q$, and NA is an imagewise numerical aperture of the projection optical system.

A second aspect of the present invention is a projection optical system as described above, wherein the aperture stop has a variable size and is located imagewise of the location Q such that vignetting is minimized when the variable size is changed.

A third aspect of the invention is a projection optical system as described above, which satisfies the following conditions:

$$0.05 < f1/L < 0.5 \quad (2)$$
$$0.02 < -f2/L < 0.2 \quad (3)$$
$$0.04 < f3/L < 0.4 \quad (4)$$
$$0.03 < -f4/L < 0.3 \quad (5)$$
$$0.04 < f5/L < 0.4 \quad (6)$$

wherein f1 through f5 are focal lengths of the first through fifth lens groups, respectively.

A fourth aspect of the present invention is an exposure apparatus for imaging a pattern present on a reticle onto a photosensitive workpiece. The apparatus comprises a reticle stage for supporting the reticle, an illumination optical system adjacent the reticle stage for illuminating the reticle, a workpiece stage for supporting a workpiece, and the projection optical system as described above arranged between the reticle stage and the workpiece stage.

A fifth aspect of the present invention is a method of patterning a photosensitive workpiece with a pattern present on a reticle. The method comprises the steps of first illuminating the reticle, then projecting light from the reticle with the projection optical system as described above, and then exposing the photosensitive workpiece over an exposure field.

A sixth aspect of the present invention is a device manufacturing method comprising the steps of first coating a photosensitive material onto a substrate, then projecting onto the substrate the image of a pattern of reticle through the projection optical system as described above, then developing the photosensitive material on the substrate, thereby forming a photoresist pattern.

BRIEF DESCRIPTION OF THE DRAWINGS

FIGS. 3A–3D are aberration plots for spherical aberration, astigmatism, distortion, and coma, respectively, for the projection optical system of FIG. 2;

FIGS. 5A–5D are aberration plots for spherical aberration, astigmatism, distortion, and coma, respectively, for the projection optical system of FIG. 4;

FIGS. 7A–7D are aberration plots for spherical aberration, astigmatism, distortion, and coma, respectively, for the projection optical system of FIG. 6;

FIGS. 9A–9D are aberration plots for spherical aberration, astigmatism, distortion, and coma, respectively, for the projection optical system of FIG. 8.

DETAILED DESCRIPTION OF THE INVENTION

The present invention relates to projection optical systems and exposure apparatus incorporating same and methods pertaining to same, and in particular to such systems, apparatus and methods for manufacturing devices and elements, such as integrated circuits, liquid crystal displays, CCD (charge coupled device) detectors, MR (magneto-resistive) heads, and the like.

Figure 1:
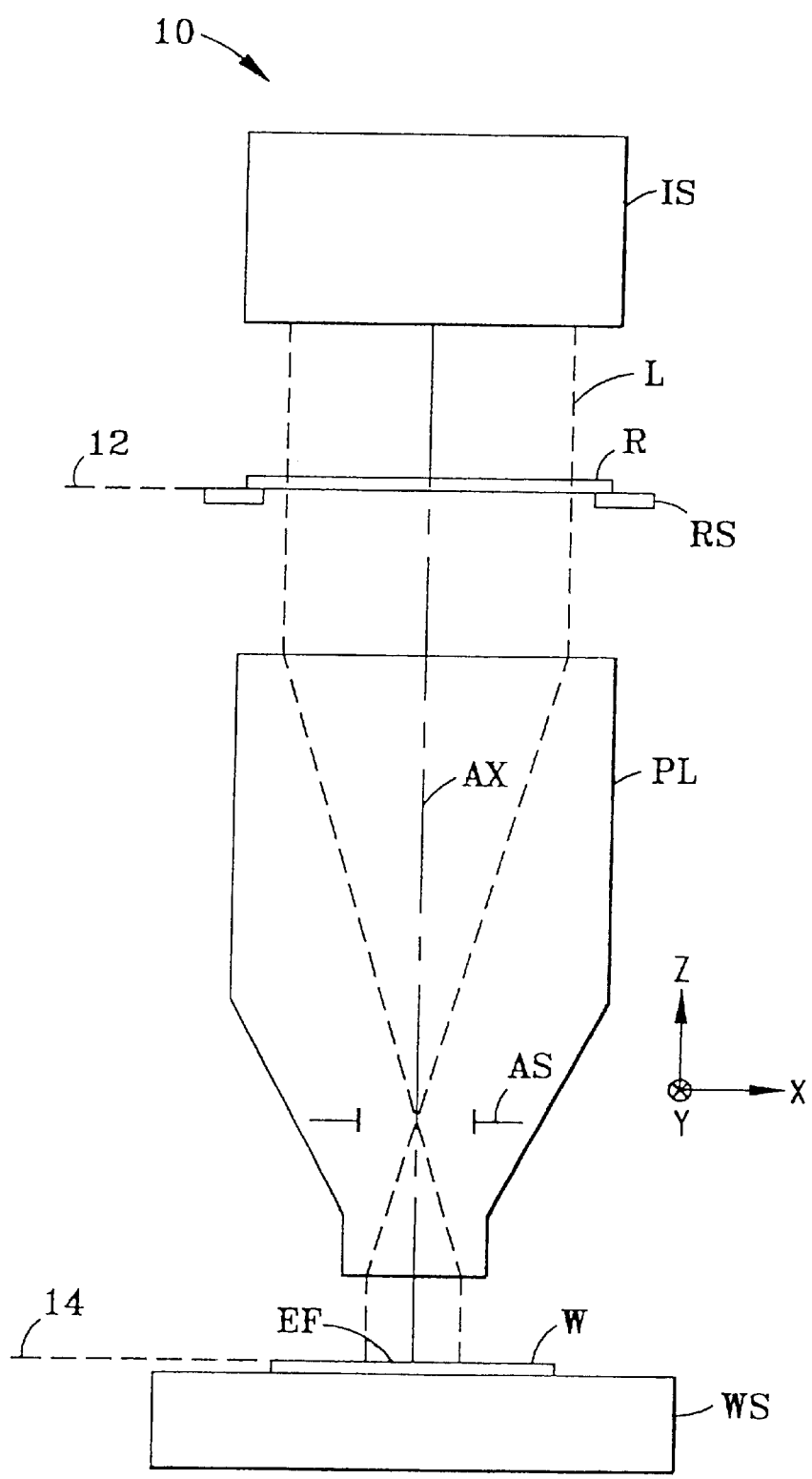
FIG. 1 is a schematic optical diagram of the projection exposure apparatus of the present invention.

With reference to FIG. 1, exposure apparatus 10 includes a projection optical system PL having an object plane 12, an image plane 14, and an aperture stop AS disposed along an optical axis A. Projection optical system PL is substantially double-telecentric. Aperture stop AS is variable and disposed in the vicinity of the pupil position. An object, such as a reticle R, is disposed at or near object plane 12. Object (mask, reticle, or original) R is typically a transparent substrate, such as fused silica, and includes a pattern (not shown) having small (i.e., micron and sub-micron) features. Object (reticle) R is held in place and moved into a position at or near object plane 12 by object (reticle) stage RS. Disposed adjacent object (reticle) R along optical axis A opposite projection lens PL is an illumination optical system IS. The latter includes an exposure light source (not shown) for generating a light beam L.

Examples of exposure light sources are: a KrF excimer laser emitting light at a wavelength of 248.4 nm, an ArF laser emitting light at a wavelength of 193 nm, a $F_2$ laser emitting light at a wavelength of 157 nm, the higher harmonics of a solid state laser (e.g. a YAG laser) emitting light at a wavelength of e.g. 248 nm, 193 nm, or 157 nm, or the various lines of a mercury arc lamp emitting a wavelength of, e.g., g-line, h-line, or i-line, mentioned above. Moreover, wavelengths associated with the higher harmonics converted from monochromatic laser light emitted from a DFB (distributed feedback) semiconductor laser or fiber laser into ultraviolet light by a nonlinear optical crystal may be employed. For example, when the range of wavelengths of the monochromatic laser are set at 1.51 to 1.59 microns, eighth-order harmonics having a wavelength range from 189 nm to 199 nm can be obtained. Likewise, tenth-order harmonics having wavelength range 151 nm to 159 nm can also be obtained. In particular, when the wavelength range of the monochromatic laser are set at 1.544 to 1.553 microns, wavelengths in the range from 193 nm to 194 nm can be obtained (i.e., the same wavelengths as from an ArF excimer laser). When the wavelength range of the monochromatic laser is set at 1.57 to 1.58 microns, tenth-order harmonics having a wavelength range from 157 nm to 158 nm can be obtained (i.e., the same as from an $F_2$ laser).

Illumination optical system IS is designed to uniformly illuminate reticle R and also to form a source image at aperture stop AS in the absence of pattern of object (reticle) R (i.e., Kohler illumination). A workpiece W, such as a silicon wafer coated with photoresist, is disposed along optical axis A at or near image plane 14. Workpiece (wafer) W is held in place and moved into position by a workpiece (wafer) stage WS.

Generally speaking, to pattern workpiece (wafer) W with exposure apparatus 10, object (reticle) R and workpiece (wafer) W are moved into proper alignment using object (reticle) stage RS and workpiece (wafer) stage WS, respectively. Object (reticle) R is then illuminated with illumination optical system IS for a certain amount of time. An image of the pattern on object (reticle) R is projected onto workpiece (wafer) W over an exposure field EF, via projection lens PL. Workpiece (wafer) stage WS then moves an incremental amount and another exposure is made on workpiece (wafer) W. The process is repeated until a desired area of workpiece (wafer) W is exposed. Exposure apparatus 10 and methods associated therewith are discussed in further detail below.

In a preferred embodiment, reticle stage RS and workpiece (wafer) stage WS are moveable along a scanning direction (e.g., the X-direction), and exposure field EF has a first dimension orthogonal to the scanning direction (e.g., the Y-direction) and a second dimension in the scanning direction. Preferably, the first dimension is greater than the second dimension. Also, in a preferred embodiment, the first dimension is approximately at least 25 mm. In the case where a stitching exposure is used, it is preferable that the first dimension be approximately at least 15 mm when the exposure field EF has a trapezoid shape, hexangular shape, parallelogram shape, diamond shape, or other such polygonal shape. Such stitching exposure methods are disclosed in U.S. Pat. Nos. 5,437,946, 5,477,304, and 5,617,182.

Projection Optical System

Figure 2:
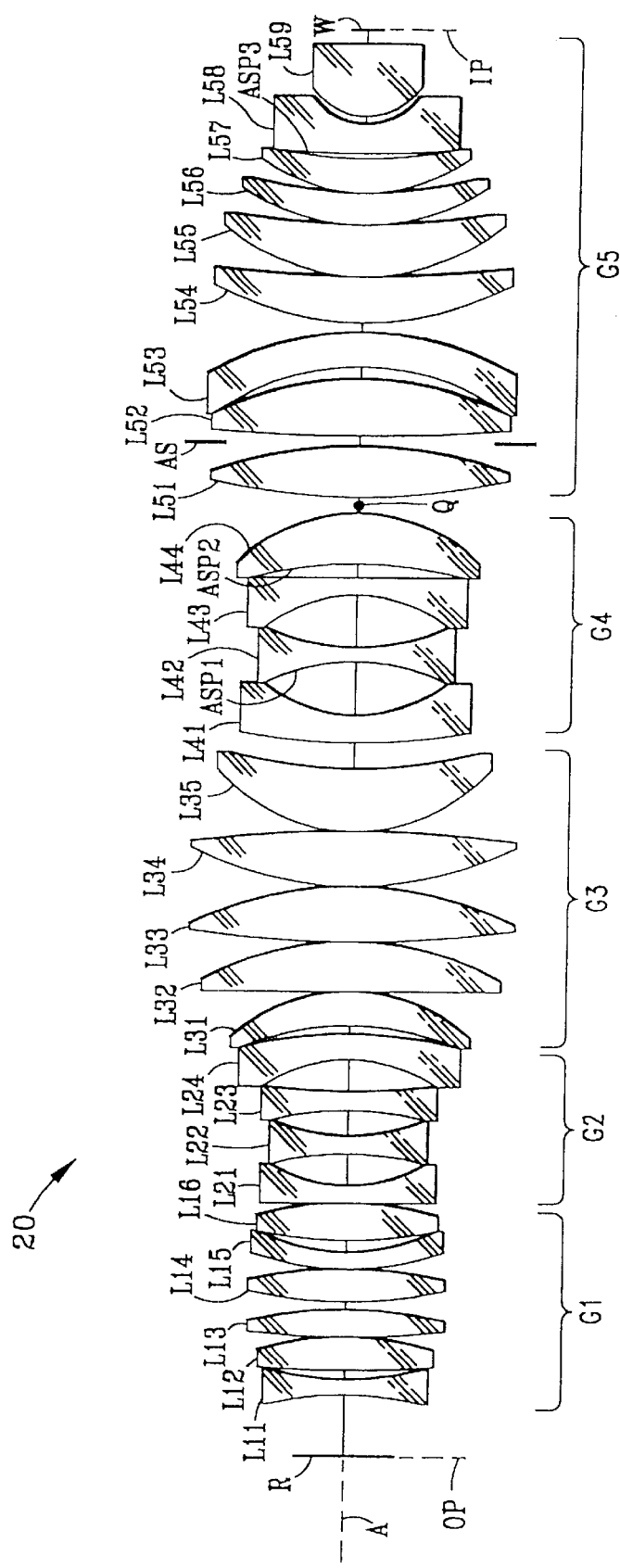
FIG. 2 is an optical diagram of the projection optical system of Working Example 1 of the present invention.
Figure 3D:
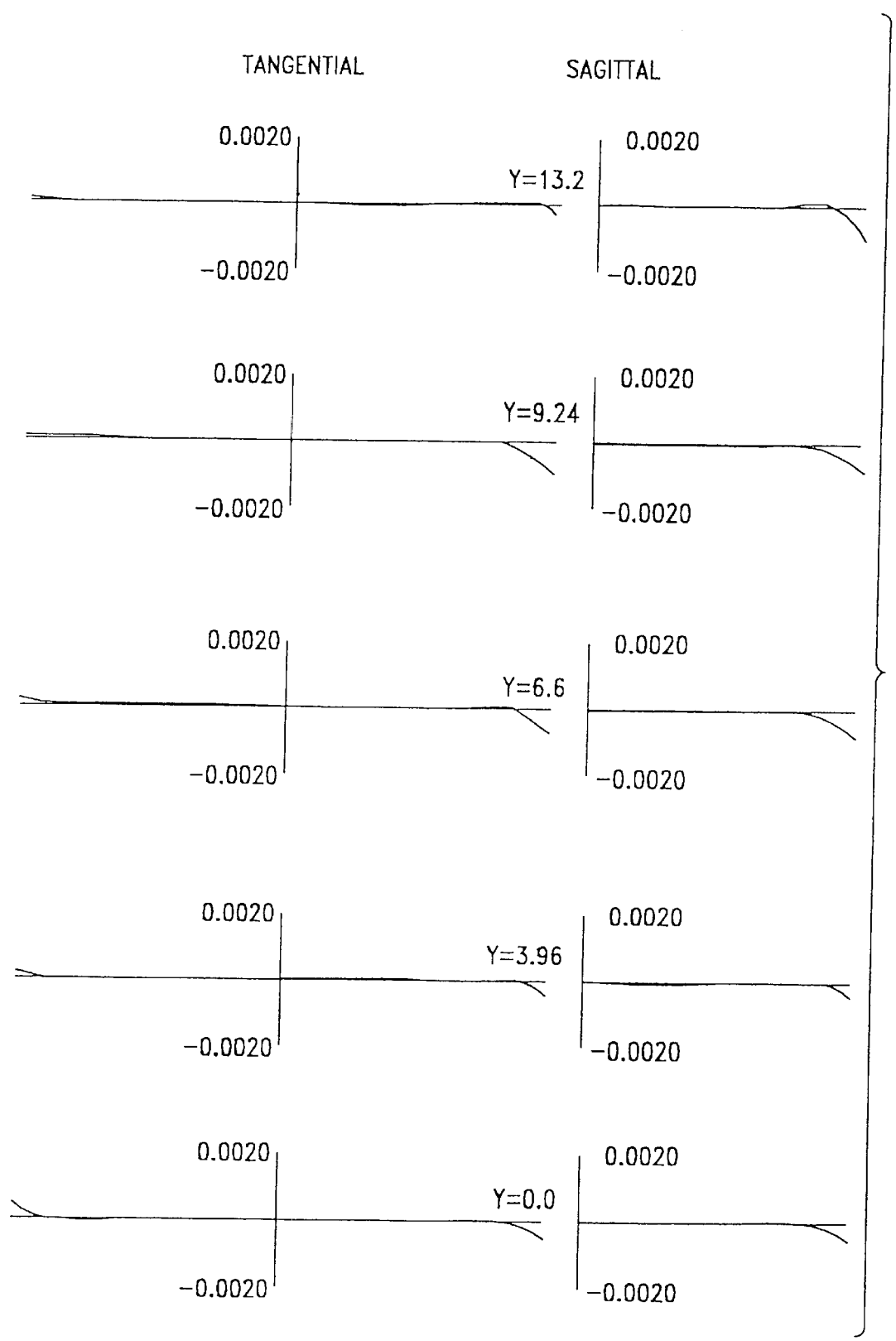

With reference now to FIG. 2, the projection optical system of the present invention is described with reference to projection optical system 20 representing a Working Example 1 of the present invention. Projection optical system 20 comprises, in order from reticle R (i.e., object plane OP) to workpiece (wafer) W (i.e., image plane IP), or "objectwise to imagewise," a first lens group G1 having positive refractive power, a second lens group G2 having negative refractive power, a third lens group G3 having positive refractive power, a fourth lens group G4 having negative refractive power, and a fifth lens group G5 having positive refractive power.

Projection optical system 20 is double-telecentric and designed to operate at a particular exposure wavelength or a narrow band centered thereon (e.g., λ=248.4 nm). A location Q wherein paraxial rays traveling parallel to optical axis A imagewise to objectwise intersect the optical axis is located between fourth lens group G4 and fifth lens group G5. A variable aperture stop AS for setting the NA is arranged imagewise of location Q in lens group G5. As a result of this configuration, the difference in vignetting over the entire surface of the exposure field EF on workpiece (wafer) W (FIG. 1) is minimized.

With continuing reference to FIG. 2 and projection optical system 20, first lens group G1 contributes principally to the correction of distortion while maintaining telecentricity. Second lens group G2 and fourth lens group G4 contribute principally to the correction of the Petzval sum and have the function of flattening image plane IP. Third lens group G3 generates positive distortion together with first lens group G1, and serves to correct negative distortion generated by second lens group G2, fourth lens group G4 and fifth lens group G5. Third lens group G3 and second lens group G2 constitute a telephoto system having a positive-negative refractive power arrangement when viewed imagewise to objectwise. This combination prevents enlargement of projection optical system 20. To cope with the increased imagewise NA, fifth lens group G5 suppresses the generation of distortion particularly in the state wherein the generation of spherical aberration is minimized, guides the light beam onto workpiece (wafer) W, and serves the role of forming an image.

It is also preferable that the projection optical system of the present invention satisfy at least one of a number of design conditions set forth below.

The first condition (1) stipulates the requirements for facilitating double-telecentricity, as well as for reducing the effects of vignetting in the exposure field. Condition (1) is expressed as $$0.01 < d_Q/\{L \times (1-NA)\} < 0.4 \tag{1}$$

wherein L is the distance from object plane OP to image plane IP, NA is the imagewise numerical aperture, and $d_Q$ is the axial distance from location Q to aperture stop AS (positive when measured from location Q imagewise).

If $d_Q/\{L \times (1-NA)\}$ exceeds the upper limit in condition (1) pupil aberration increases excessively and it is difficult to obtain double-telecentricity. Conversely, if $d_Q/\{L \times (1-NA)\}$ falls below the lower limit in condition (1), overcorrection of pupil aberration results as the Petzval sum approaches zero, which enlarges the projection optical system.

It is also preferable in the projection optical system of the present invention that variable aperture stop AS be arranged imagewise of location Q. This minimizes the difference in vignetting over the exposure field when the NA is changed by varying the size of aperture stop AS. With continuing reference to FIG. 2, the advantage of this configuration can be understood by considering a parallel light beam (not shown) entering projection optical system 20 imagewise to objectwise. The paraxial principle rays of this beam intersect optical axis A at location Q, due to refraction of the positive lenses imagewise of location Q. Since these positive lenses have positive refractive power, a parallel light beam impinging thereon at a predetermined angle with respect to optical axis A forms an image at a position imagewise from location Q. Accordingly, if aperture stop AS is located imagewise of location Q, the effect of vignetting at the periphery of the exposure field due to the field curvature of the pupil can, for practical purposes, be adequately controlled. Also, the various aberrations can be satisfactorily corrected, even if the size of aperture stop AS is varied.

The second design condition stipulates the optimal refractive power range for first lens group G1 and is expressed as:

$$0.05 < f1/L < 0.5 \tag{2}$$

wherein f1 is the focal length of first lens group G1. If f1/L exceeds the upper limit in condition (2), positive distortion generated by first lens group G1 cannot be fully corrected by the negative distortion generated by second, fourth and fifth lens groups G2, G4 and O5. Conversely, if f1/L falls below the lower limit in condition (2), high-order positive distortion is generated.

A third design condition stipulates the optimal refractive power range for second lens group G2 and is expressed as:

$$0.02 < -f2/L < 0.2 \quad (3)$$

wherein f2 is the focal length of second lens group G2. If −f2/L exceeds the upper limit in condition (3), the correction of the Petzval sum is not sufficiently corrected, making it difficult to flatten the image plane. Conversely, if −f2/L falls below the lower limit in condition (3), the generation of negative distortion increases, and it becomes difficult to satisfactorily correct such a large negative distortion by just first and third lens groups Gland G3.

A fourth design condition stipulates the optimal refractive power range for third lens group G3 and is expressed as:

$$0.04 < f3/L < 0.4 \quad (4)$$

wherein f3 is the focal length of third lens group G3. If f3/L exceeds the upper limit in condition (4), the projection optical system increases in size, since the telephoto ratio of the telephoto system formed by second lens group G2 and third lens group G3 increases. In addition, positive distortion generated by third lens group G3 decreases, and negative distortion generated by second, fourth and fifth lens groups G2, G4 and OS can no longer be satisfactorily corrected. Conversely, if f3/L falls below the lower limit in condition (4), satisfactory imaging performance can no longer be obtained due to the generation of high-order spherical aberration.

A fifth design condition stipulates the optimal refractive power range for fourth lens group G4 and is expressed as:

$$0.03 < -f4/L < 0.3 \quad (5)$$

wherein f4 is the focal length of fourth lens group G4. If −f4/L exceeds the upper limit in condition (5), the Petzval sum not sufficiently corrected, making it difficult to achieve a flat image plane. Conversely, if −f4/L falls below the lower limit in condition (5), high-order spherical aberration and coma is generated.

A sixth design condition stipulates the optimal refractive power of fifth lens group G5 is expressed as:

$$0.04 < f5/L < 0.4 \quad (6)$$

wherein f5 is the focal length of fifth lens group G5. If f5/L exceeds the upper limit in condition (6), the overall refractive power of fifth lens group G5 is excessively weak, which enlarges the projection optical system. Conversely, if f5/L falls below the lower limit in condition (6), high-order spherical aberration is generated and image contrast deteriorates.

In addition to satisfying at least one of the above design conditions, it is also preferable that the projection optical system of the present invention have one or more aspherical surfaces, each having a paraxial (i.e., near-axis) region, a periphery (i.e., the portion of the surface farthest from the axis), and refractive power.

With continuing reference to projection optical system 20 of FIG. 2, in a first preferred embodiment, fourth lens group G4 has at least one aspherical surface ASP1, and fourth or fifth lens group G4 or G5 has at least one aspherical surface ASP2 arranged between aspherical surface ASP1 and aperture stop AS. In addition, fifth lens group G5 has at least one aspherical surface ASP3 arranged imagewise of aperture stop AS. By arranging at least one aspherical surface (e.g., ASP1) in fourth lens group G4, it becomes possible to suppress the generation of field angle-related aberrations (sagittal coma, in particular), which has a tendency to remain in bright (i.e., large NA) dioptric optical systems comprising only spherical surfaces. It is preferable that aspherical surface ASP1 is concave, and that it have a shape at the lens periphery that weakens the refractive power relative to that at the paraxial region. Namely, it is preferred that aspherical surface ASP1 be such that the refractive power at the periphery be more negative than the refractive power at the paraxial region.

It is also preferable to arrange aspherical surface ASP2 between aspherical surface ASP1 and aperture stop AS in fourth lens group G4 and fifth lens group G5, and to arrange aspherical surface ASP3 in fifth lens group G5 imagewise of aperture stop AS. This arrangement makes it possible to correct aberrations introduced by the aspherical surfaces before and after aperture stop AS, and to correct high-order spherical aberration without worsening distortion and coma.

With continuing reference to FIG. 2, in one preferred embodiment, aspherical surface ASP1 is concave such that the refractive power at the periphery is weaker than that in the paraxial region. It is also preferred that aspherical surface ASP2 be either convex such that the refractive power at the periphery is weaker than that at the paraxial region, or concave such that the refractive power at the periphery is stronger than that in the paraxial region. Namely, it is preferred that aspherical surface ASP2 be such that the refractive poiwer at the periphery be more negative than the refractive power at the paraxial region.

In another preferred embodiment, aspherical surface ASP3 is either convex such that the refractive power at the periphery is weaker than that at the paraxial region or concave such that the refractive power at the periphery is stronger than that at the paraxial region. Namely, it is preferred that aspherical surface ASP3 be such that refractive power at the periphery be more negative than refractive power at the paraxial region. In this case, it is preferable to set the refractive power at the periphery such that it returns slightly in the direction of the refractive power in the paraxial region.

In addition to the above preferred embodiments, it also preferable in the present invention if additional aspherical surfaces are arranged outside of fourth lens group G4 and fifth lens group G5, i.e., in first, second and third groups G1, G2 and G3, since such arrangement is effective for further correcting aberrations.

Figure 4:
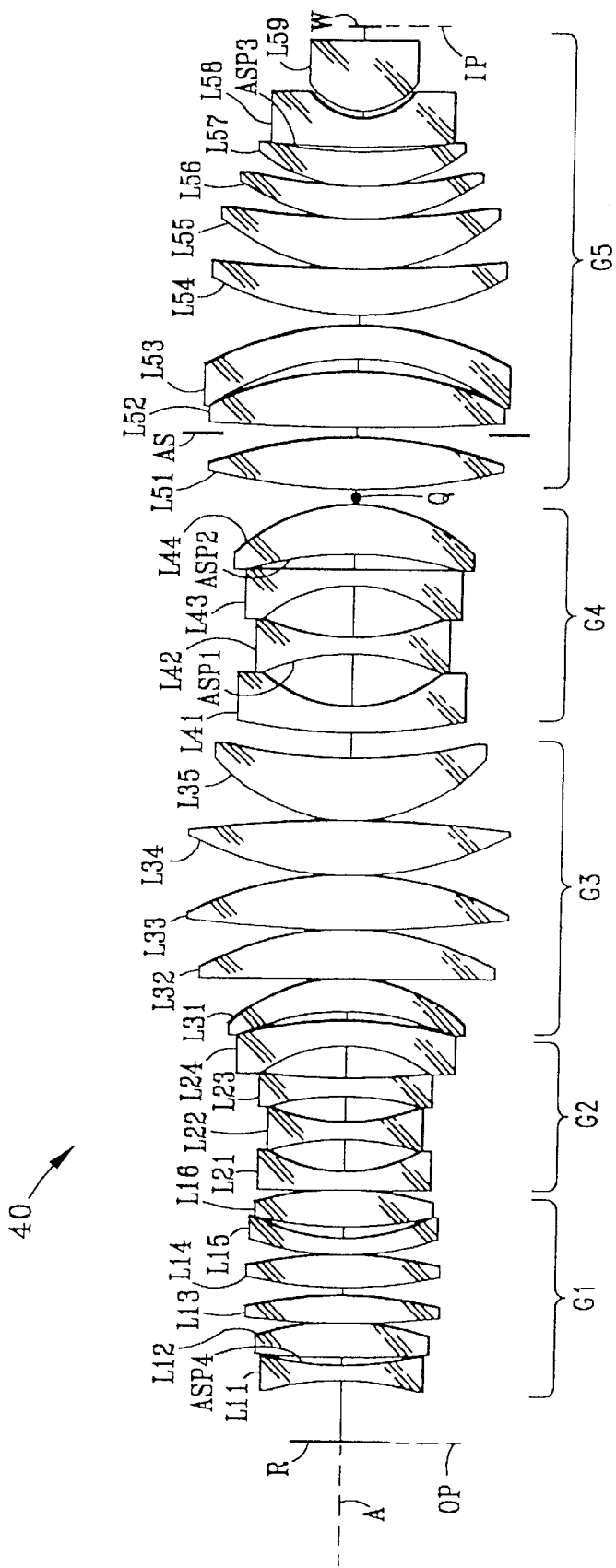
FIG. 4 is an optical diagram of the projection optical system of Working Example 2 of the present invention.
Figure 5D:
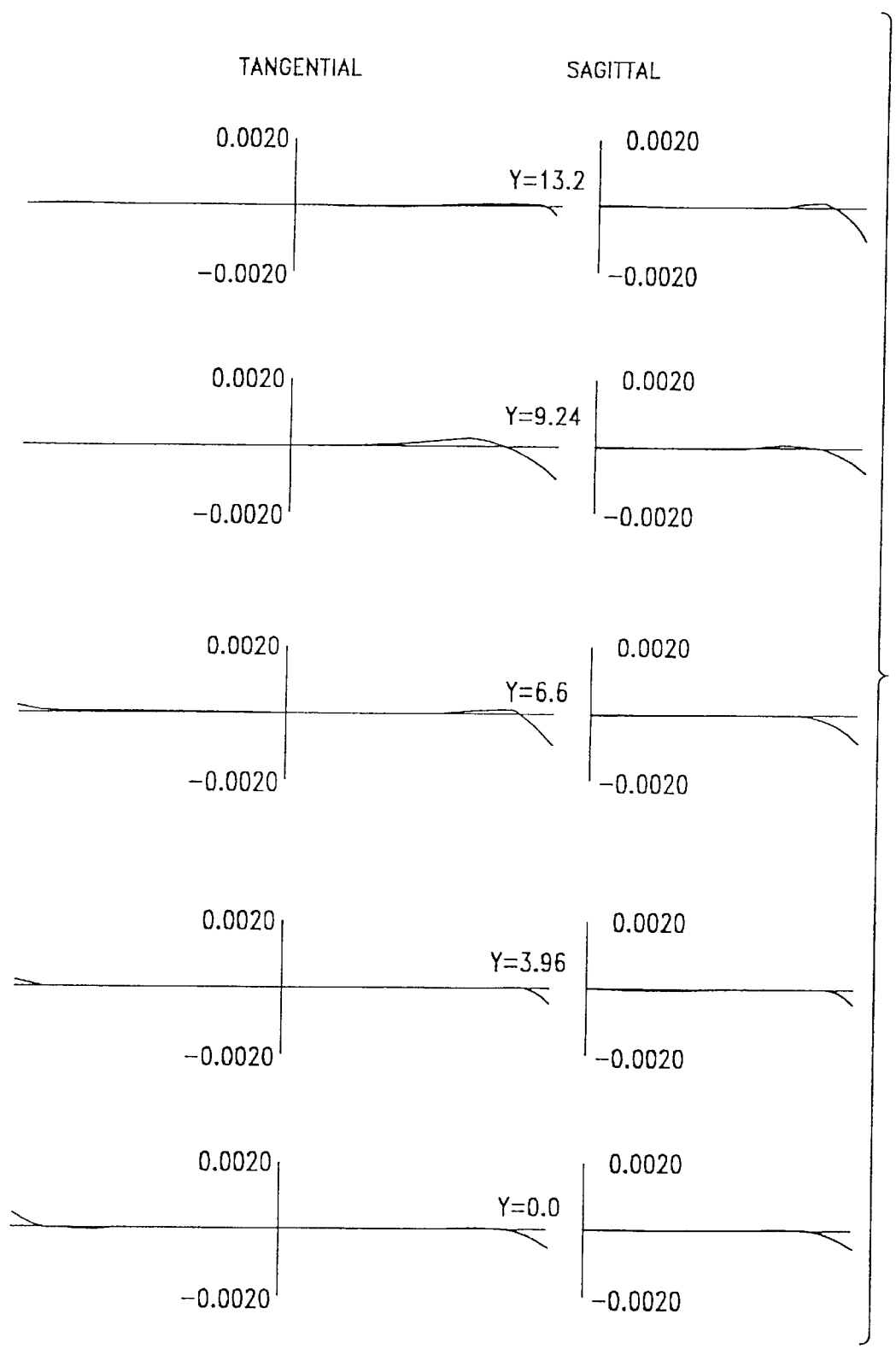

Accordingly, with reference now to FIG. 4 and projection optical system 40, in another preferred embodiment of the present invention, the projection optical system includes aspheric surfaces ASP1–ASP3, as described above, and further includes least one aspherical surface ASP4 in first lens group G1. This arrangement facilitates correcting distortion.

Figure 6:
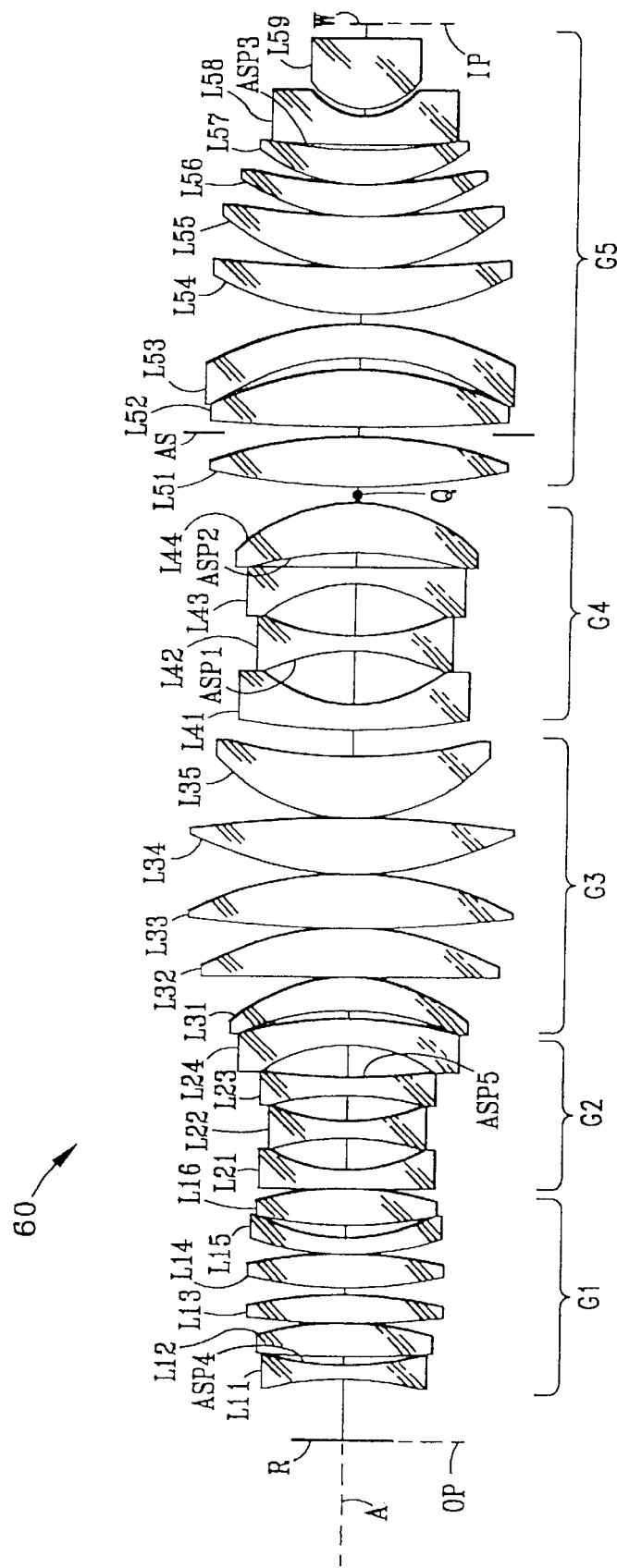
FIG. 6 is an optical diagram of the projection optical system of Working Example 3 of the present invention.
Figure 7D:
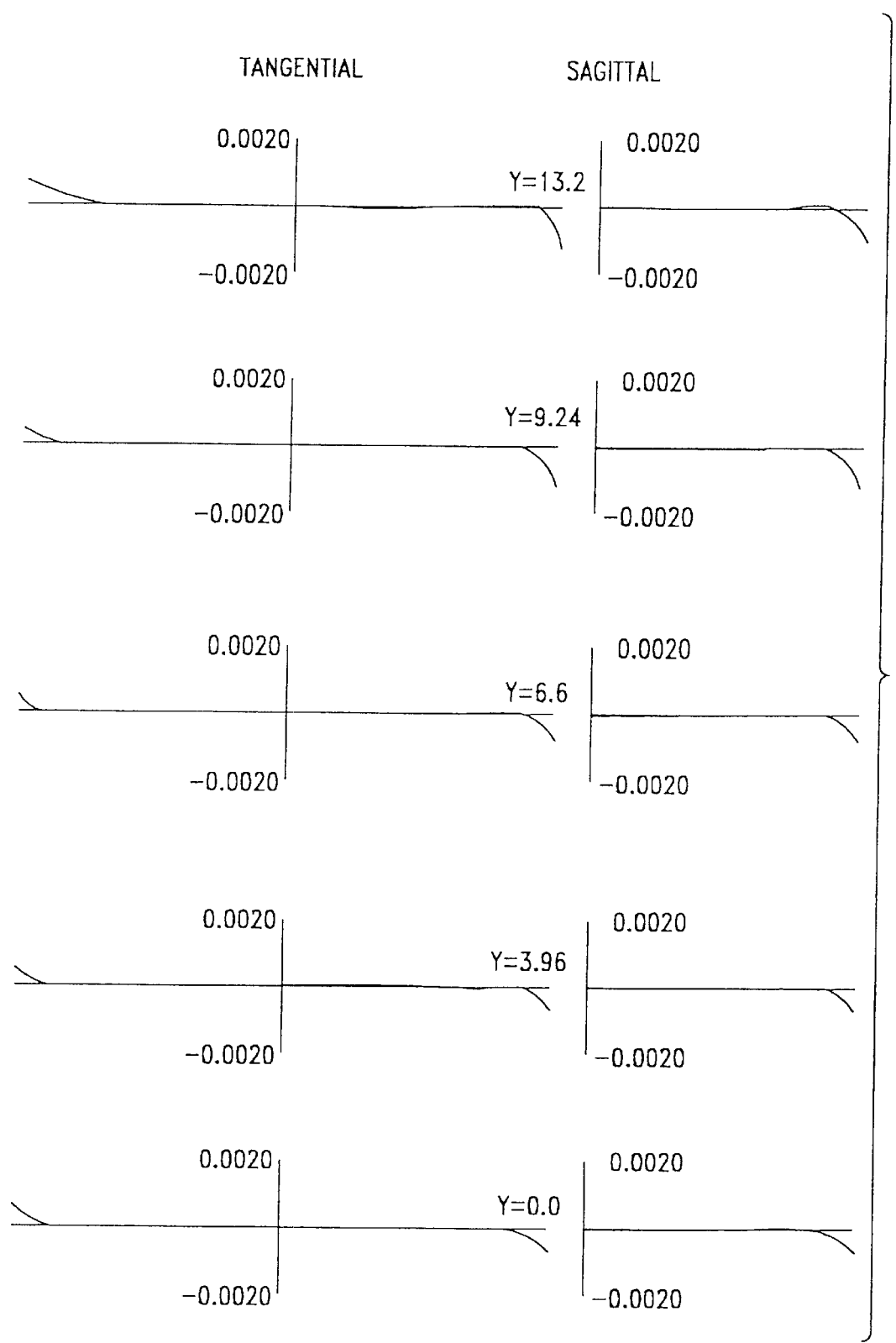

With reference now to FIG. 6 and projection optical system 60, in a further preferred embodiment of the present invention, the projection optical system includes aspheric surfaces ASP1–ASP3, as described above, and further includes least one aspherical surface ASP5 in second lens group G2. This arrangement facilitates correcting entrance pupil aberration (displacement of the entrance pupil as a function of object height).

Figure 8:
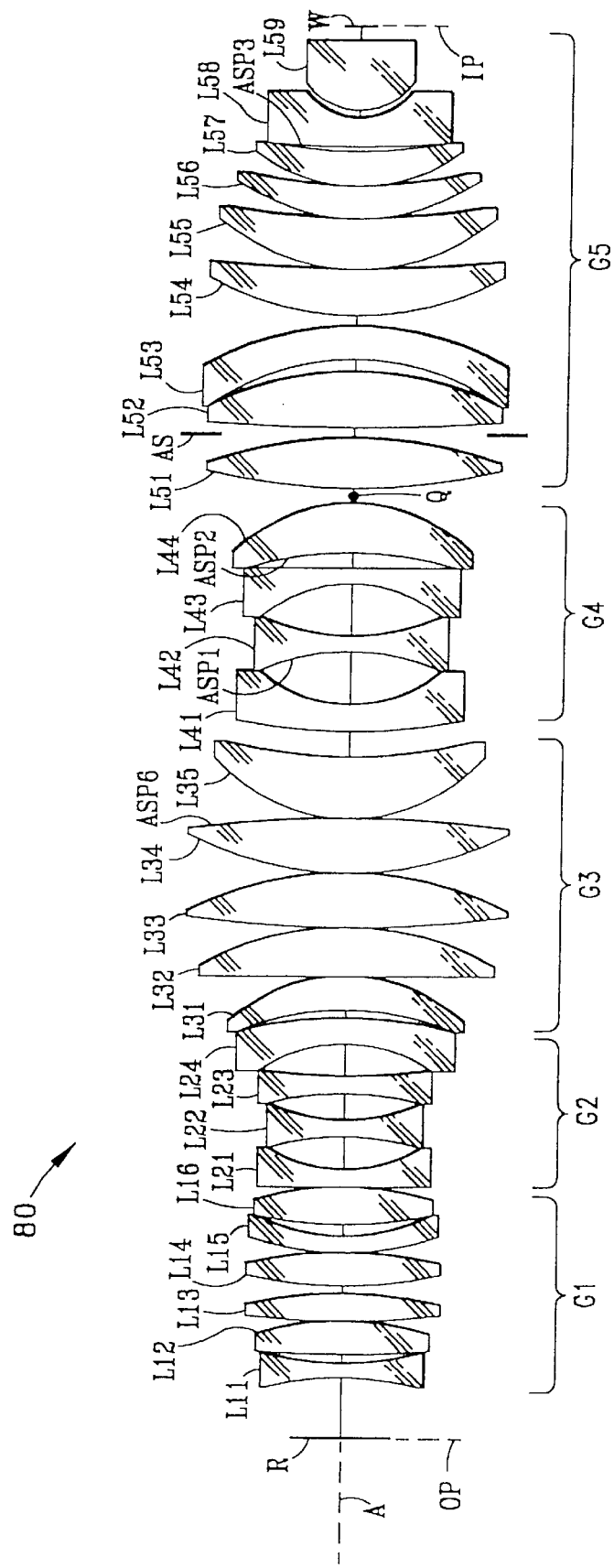
FIG. 8 is an optical diagram of the projection optical system of Working Example 4 of the present invention.
Figure 9D:
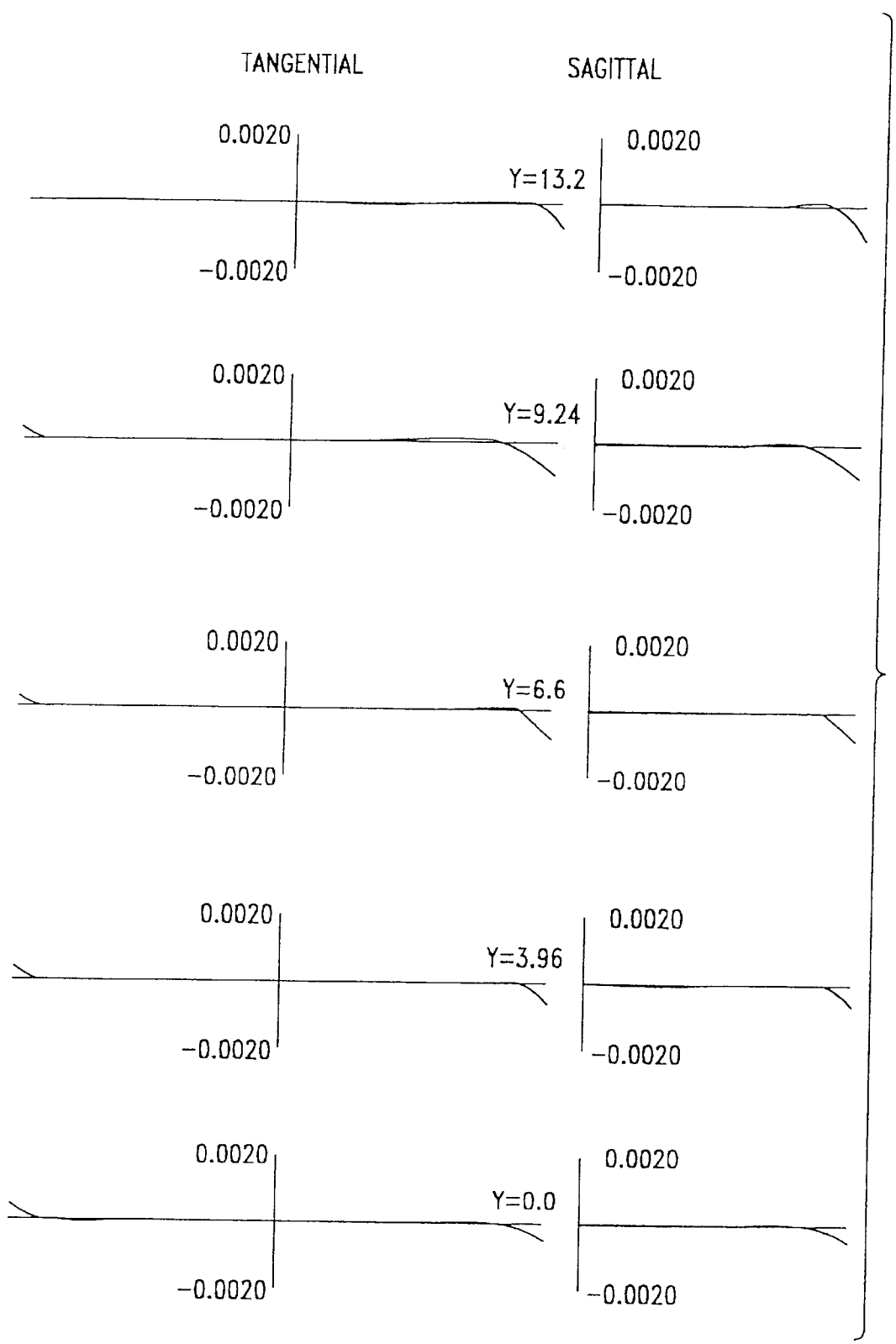

With reference now to FIG. 8 and projection optical system 80, in another preferred embodiment of the present invention, the projection optical system includes aspheric surfaces ASP1–ASP3, as described above, and further includes least one aspherical surface ASP6 in third lens group G3. This arrangement facilitates correcting coma.

With reference again to FIG. 1, since a double-telecentric projection optical system with a high NA can be provided in exposure apparatus 10, high resolution is obtained and the projection magnification does not change even if warpage of object (reticle) R and/or workpiece (wafer) W occurs. Accordingly, exposure can be performed at a high resolving power and with no image distortion. In addition, large chip patterns can be exposed at one time, since a large exposure field EF is possible.

Working Examples of the Projection Optical System

Four Working Examples are set forth below in Tables 1–4 which set forth the design specifications (Tables 1A–4A), values of the aspherical surface coefficients for the aspheric surfaces (Tables 1B–4B), and values for the parameters and design conditions of Working Examples 1–4 (Tables 1C–4C). In Tables 1A–4A, D0 is the axial distance from object (reticle) R to the most objectwise lens surface of first lens group G1, WD is the axial distance (working distance) from the most imagewise lens surface of fifth lens group G5 to workpiece (wafer) W, β is the projection magnification of the projection optical system, NA is the image-side numerical aperture of the projection optical system, $d_{EX}$ is the diameter of exposure field EF on workpiece (wafer) W (see FIG. 1), and L is the axial distance between the object (reticle) R (i.e., object plane OP) and workpiece (wafer) W (i.e., image plane IP). In Tables 1A–4A, S is the surface number of the optical components arranged objectwise to imagewise, r is the radius of curvature of the corresponding lens surface, d is the axial distance between adjacent lens surfaces, n is the refractive index of the glass at wavelength λ=248.4 nm. Silica glass, for example, can be used as the glass material. The unit of measurement of the radius of curvature r and the axial distance d is millimeters, for example.

Also, in Tables 1B–4B, "E" denotes "exponential" such that "En" means "10ⁿ".

The expression for an aspherical surface is as follows:

$$Z = \{ch^2/(1+\sqrt{1-(1+\kappa)c^2h^2})\} + Ah^4 + Bh^6 + Ch^8 + Dh^{10} + Eh^{12} + Fh^{14}$$

wherein Z is the amount of sag of a surface parallel to the optical axis, c is the curvature at he apex of the surface, h is the distance from the optical axis, and K is the conical coefficient. he letters A, B, C, D, E, F are aspherical surface coefficients.

In the Working Examples below, if the maximum value of the $NA = NA_{MAX} = 0.8$ and the variable range of the NA is set to approximately 60% of the maximum value, then the variable range of NA due to varying the size of aperture stop AS becomes approximately $0.5 \leq NA \leq 0.8$ (i.e., $0.6 \times NA_{MAX} \leq NA \leq NA_{MAX}$).

FIGS. 3A–3D, 5A–5D, 7A–7D and 9A–9D are aberration plots for spherical aberration (3A–9A), astigmatism (3B–9B), distortion (3C–9C) and coma (tangential and sagittal) (3D–9D) for Working Examples 1–4, respectively. In each aberration plot, Y is the image height. In the astigmatism plots (3B–9B), the broken line represents the tangential image plane and the solid line represents the sagittal image plane.

WORKING EXAMPLE 1

With reference to FIG. 2, projection optical system 20 represents Working Example 1 of the present invention. Projection optical system 20 is double-telecentric and comprises, objectwise to imagewise, as described above, a first lens group G1 having positive refractive power, a second lens group G2 having negative refractive power, a third lens group G3 having positive refractive power, a fourth lens group G4 having negative refractive power, and a fifth lens group G5 having positive refractive power. Projection optical system 20 is double-telecentric. Location Q is located between fourth lens group G4 and fifth lens group G5, and variable aperture stop AS is arranged imagewise of location Q. This configuration minimizes the difference in vignetting over the entire surface of exposure field EF (FIG. 1) on workpiece (wafer) W.

Projection optical system 20 further comprises an aspherical surface ASP1 located in fourth lens group G4, an aspherical surface ASP2 arranged between aspherical surface ASP1 and aperture stop AS, and an aspherical surface ASP3 arranged in fifth lens group G5 imagewise of aperture stop AS.

TABLE 1A

DESIGN SPECIFICATIONS FOR WORKING EXAMPLE 1

D0 = 56.938
WD = 8.558
|β| = 1/4
Maximum NA = 0.8
$d_{EX}$ = 26.4
L = 1189.996

| S | r | d | n | |
|---|---|---|---|---|
| 1 | −255.627 | 13.000 | 1.50839 | |
| 2 | 306.419 | 8.567 | 1 | |
| 3 | 1565.905 | 26.363 | 1.50839 | |
| 4 | −286.322 | 1.000 | 1 | |
| 5 | 828.381 | 24.476 | 1.50839 | |
| 6 | −314.474 | 1.000 | 1 | |
| 7 | 332.392 | 29.451 | 1.50839 | |
| 8 | −407.364 | 1.000 | 1 | |
| 9 | 271.626 | 17.000 | 1.50839 | |
| 10 | 204.642 | 6.844 | 1 | |
| 11 | 311.458 | 31.538 | 1.50839 | |
| 12 | −295.797 | 1.000 | 1 | |
| 13 | −2000.000 | 12.436 | 1.50839 | |
| 14 | 152.723 | 25.832 | 1 | |
| 15 | −224.897 | 12.000 | 1.50839 | |
| 16 | 194.016 | 23.075 | 1 | |
| 17 | −228.159 | 12.500 | 1.50839 | |
| 18 | 750.000 | 29.560 | 1 | |
| 19 | −125.249 | 18.000 | 1.50839 | |
| 20 | −456.292 | 6.197 | 1 | |
| 21 | −316.444 | 29.551 | 1.50839 | |
| 22 | −168.563 | 1.000 | 1 | |
| 23 | ∞ | 40.572 | 1.50839 | |
| 24 | −267.422 | 1.000 | 1 | |
| 25 | 2178.298 | 44.226 | 1.50839 | |
| 26 | −317.500 | 1.000 | 1 | |
| 27 | 309.182 | 47.253 | 1.50839 | |
| 28 | −1355.659 | 1.000 | 1 | |
| 29 | 171.033 | 46.299 | 1.50839 | |
| 30 | 475.084 | 20.092 | 1 | |
| 31 | 465.958 | 20.807 | 1.50839 | |
| 32 | 118.116 | 46.763 | 1 | |
| 33 | −211.023 | 12.000 | 1.50839 | (ASP1) |
| 34 | 186.008 | 44.783 | 1 | |
| 35 | −120.544 | 12.850 | 1.50839 | |
| 36 | ∞ | 11.955 | 1 | |
| 37 | −477.419 | 39.938 | 1.50839 | (ASP2) |
| 38 | −169.642 | 4.108 | 1 | |
| 39 | ∞ | 8.892 | 1 | (Q) |
| 40 | 684.757 | 40.830 | 1.50839 | |
| 41 | −391.691 | 0.000 | 1 | |
| 42 | ∞ | 9.043 | 1 | (AS) |
| 43 | 1500.000 | 49.893 | 1.50839 | |
| 44 | −274.486 | 12.401 | 1 | |
| 45 | −214.316 | 27.250 | 1.50839 | |
| 46 | −282.306 | 10.000 | 1 | |

TABLE 1A-continued

DESIGN SPECIFICATIONS FOR WORKING EXAMPLE 1

D0 = 56.938
WD = 8.558
$|\beta| = 1/4$
Maximum NA = 0.8
$d_{EX} = 26.4$
L = 1189.996

| S | r | d | n | |
|---|---|---|---|---|
| 47 | 260.941 | 40.402 | 1.50839 | |
| 48 | 1227.057 | 1.000 | 1 | |
| 49 | 188.000 | 39.918 | 1.50839 | |
| 50 | 444.771 | 1.000 | 1 | |
| 51 | 178.000 | 29.205 | 1.50839 | |
| 52 | 308.876 | 1.000 | 1 | |
| 53 | 149.162 | 33.190 | 1.50839 | |
| 54 | 476.624 | 3.871 | 1 | (ASP3) |
| 55 | 613.189 | 24.077 | 1.50839 | |
| 56 | 65.511 | 6.493 | 1 | |
| 57 | 66.070 | 60.000 | 1.50839 | |
| 58 | 367.843 | (WD) | 1 | |

TABLE 1B

VALUES OF ASPHERICAL COEFFICIENTS

Surface ASP1 c = −4.73883E−04
κ = 1.212633
A = −1.37869E−08
B = 3.11693E−12
C = 5.04656E−17
D = 6.46573E−22
E = −3.20804E−25
F = 1.66371E−29

Surface ASP2 c = 2.09459E−03
κ = −0.419761
A = −3.03031E−09
B = −3.82761E−13
C = 4.92647E−18
D = −1.27524E−21
E = 1.11209E−25
F = −4.75978E−30

Surface ASP3 c = 2.09809E−03
κ = 0
A = 6.78816E−09
B = 9.68697E−13
C = −5.23581E−17
D = 1.18829E−21
E = 0
F = 0

TABLE 1C

PARAMETERS AND DESIGN CONDITION VALUES (1) $0.084 \leq d_O/\{L \times (1-NA)\} \leq 0.209$
(2) f1/L = 0.125
(3) −f2/L = 0.046
(4) f3/L = 0.102
(5) −f4/L = 0.079
(6) f5/L = 0.109
f1 = 148.730
f2 = −54.952
f3 = 120.942
f4 = −93.589
f5 = 129.783

TABLE 1C-continued

PARAMETERS AND DESIGN CONDITION VALUES

L = 1189.996
d = 49.722
NA = 0.8~0.5

As can be seen from aberration plots 3A–3D for Working Example 1 of the present invention, distortion in particular is satisfactorily corrected over the entire large exposure region, and other aberrations are also well corrected with good balance. In addition, even though projection optical system 20 is double-telecentric with a maximum value of the NA=0.8, the effects of vignetting are small, and the various aberrations remain satisfactorily corrected even if the NA is greatly changed. The present Working Example can be applied to a slit-like (rectangular) shape exposure field (e.g., 26 mm×8 mm, or 26 mm×5 mm).

WORKING EXAMPLE 2

With reference to FIG. 4, projection optical system 40 represents Working Example 2 of the present invention, and has essentially the same basic configuration of lens groups as projection optical system 20 of FIG. 2, including the locations of aspherical surfaces ASP1–APS3. Projection optical system 40 further includes an aspherical surface ASP4 arranged in first lens group G1.

TABLE 2A

DESIGN SPECIFICATIONS FOR WORKING EXAMPLE 2

D0 = 56.937
WD = 8.556
$|\beta| = 1/4$
Maximum NA = 0.8
$d_{EX} = 26.4$
L = 1190.293

| S | r | d | n | |
|---|---|---|---|---|
| 1 | −255.794 | 13.000 | 1.50839 | |
| 2 | 304.711 | 8.549 | 1 | (ASP4) |
| 3 | 1523.076 | 26.352 | 1.50839 | |
| 4 | −290.961 | 1.000 | 1 | |
| 5 | 707.183 | 24.451 | 1.50839 | |
| 6 | −337.153 | 1.000 | 1 | |
| 7 | 342.978 | 29.211 | 1.50839 | |
| 8 | −406.487 | 1.000 | 1 | |
| 9 | 262.194 | 17.000 | 1.50839 | |
| 10 | 192.603 | 6.830 | 1 | |
| 11 | 282.569 | 31.441 | 1.50839 | |
| 12 | −296.721 | 1.000 | 1 | |
| 13 | −2000.000 | 12.774 | 1.50839 | |
| 14 | 156.410 | 25.862 | 1 | |
| 15 | −217.396 | 12.000 | 1.50839 | |
| 16 | 193.187 | 23.071 | 1 | |
| 17 | −229.962 | 12.500 | 1.50839 | |
| 18 | 753.548 | 29.591 | 1 | |
| 19 | −125.018 | 18.000 | 1.50839 | |
| 20 | −470.631 | 6.215 | 1 | |
| 21 | −322.848 | 29.532 | 1.50839 | |
| 22 | −168.545 | 1.000 | 1 | |
| 23 | ∞ | 40.488 | 1.50839 | |
| 24 | −267.922 | 1.000 | 1 | |
| 25 | 2058.177 | 44.221 | 1.50839 | |
| 26 | −319.862 | 1.000 | 1 | |
| 27 | 308.013 | 47.495 | 1.50839 | |
| 28 | −1379.214 | 1.000 | 1 | |
| 29 | 171.065 | 46.313 | 1.50839 | |
| 30 | 475.356 | 20.101 | 1 | |
| 31 | 465.085 | 20.822 | 1.50839 | |

TABLE 2A-continued

DESIGN SPECIFICATIONS FOR WORKING EXAMPLE 2

$D0 = 56.937$
$WD = 8.556$
$|\beta| = 1/4$
Maximum NA = 0.8
$d_{EX} = 26.4$
$L = 1190.293$

| S | r | d | n | |
|---|---|---|---|---|
| 32 | 118.145 | 46.805 | 1 | |
| 33 | −210.732 | 12.000 | 1.50839 | (ASP1) |
| 34 | 186.081 | 44.774 | 1 | |
| 35 | −120.565 | 12.850 | 1.50839 | |
| 36 | ∞ | 11.978 | 1 | |
| 37 | −477.987 | 39.928 | 1.50839 | (ASP2) |
| 38 | −169.679 | 4.102 | 1 | |
| 39 | ∞ | 8.911 | 1 | (Q) |
| 40 | 682.568 | 40.816 | 1.50839 | |
| 41 | −391.897 | 0.000 | 1 | |
| 42 | ∞ | 9.070 | 1 | (AS) |
| 43 | 1500.000 | 49.868 | 1.50839 | |
| 44 | −274.701 | 12.416 | 1 | |
| 45 | −214.373 | 27.250 | 1.50839 | |
| 46 | −282.422 | 10.000 | 1 | |
| 47 | 260.913 | 40.405 | 1.50839 | |
| 48 | 1226.772 | 1.000 | 1 | |
| 49 | 188.000 | 39.907 | 1.50839 | |
| 50 | 444.503 | 1.000 | 1 | |
| 51 | 178.000 | 29.185 | 1.50839 | |
| 52 | 308.504 | 1.000 | 1 | |
| 53 | 149.159 | 33.191 | 1.50839 | |
| 54 | 474.418 | 3.897 | 1 | (ASP3) |
| 55 | 612.596 | 24.177 | 1.50839 | |
| 56 | 65.478 | 6.451 | 1 | |
| 57 | 66.000 | 60.000 | 1.50839 | |
| 58 | 368.643 | (WD) | 1 | |

TABLE 2B

VALUES OF ASPHERICAL COEFFICIENTS

Surface ASP1

$c = -4.74536E-03$
$\kappa = 1.223505$
$A = -1.41105E-08$
$B = 3.15056E-12$
$C = 5.33738E-17$
$D = 6.14925E-22$
$E = -3.11253E-25$
$F = 1.59082E-29$ Surface ASP2

$c = -2.09211E-03$
$\kappa = -0.445417$
$A = -2.99871E-09$
$B = -3.87784E-13$
$C = 4.85381E-18$
$D = -1.27131E-21$
$E = 1.09975E-25$
$F = -4.70926E-30$ Surface ASP3

$c = 2.10785E-03$
$\kappa = 0$
$A = 6.70585E-09$
$B = 9.66412E-13$
$C = -5.16458E-17$
$D = 1.16221E-21$
$E = 0$
$F = 0$

TABLE 2B-continued

VALUES OF ASPHERICAL COEFFICIENTS

Surface ASP4

$c = 3.28179E-03$
$\kappa = 0$
$A = -3.81013E-09$
$B = 2.15522E-13$
$C = 7.31492E-18$
$D = -1.31012E-21$
$E = 0$
$F = 0$

TABLE 2C

PARAMETERS AND DESIGN CONDITION VALUES (1) $0.084 \leq d_O/\{L \times (1-NA)\} \leq 0.209$
(2) $f1/L = 0.125$
(3) $-f2/L = 0.046$
(4) $f3/L = 0.101$
(5) $-f4/L = 0.079$
(6) $f5/L = 0.109$
$f1 = 148.873$
$f2 = -54.783$
$f3 = 120.796$
$f4 = -93.618$
$f5 = 129.808$
$L = 1190.293$
$d = 49.726$
$NA = 0.8\sim0.5$ As can be seen from aberration plots 5A–5D for Working Example 2 of the present invention, distortion in particular is satisfactorily corrected over the entire large exposure region, and other aberrations are also well corrected with good balance. In addition, even though projection optical system 40 is double-telecentric with a maximum value of the NA=0.8, the effects of vignetting are small, and the various aberrations remain satisfactorily corrected even if the NA is greatly changed. The present Working Example can be applied to a slit-like (rectangular) shape exposure field (e.g., 26 m×8 mm or 26 mm×5 mm).

WORKING EXAMPLE 3

With reference to FIG. 6, projection optical system 60 represents Working Example 3 of the present invention, and has essentially the same basic configuration of lens groups as projection optical system 20 of FIG. 2, including the locations of aspherical surfaces ASP1–APS3. Projection optical system 60 further includes an aspherical surface ASP5 is arranged in second lens group G1.

TABLE 3A

DESIGN SPECIFICATIONS FOR WORKING EXAMPLE 3

$D0 = 56.947$
$WD = 7.678$
$|\beta| = 1/4$
Maximum NA = 0.8
$d_{EX} = 26.4$
$L = 1191.307$

| S | r | d | n |
|---|---|---|---|
| 1 | −295.194 | 13.000 | 1.50839 |
| 2 | 307.090 | 11.543 | 1 |
| 3 | 2094.974 | 20.585 | 1.50839 |

TABLE 3A-continued

DESIGN SPECIFICATIONS FOR WORKING EXAMPLE 3

$D0 = 56.947$
$WD = 7.678$
$|\beta| = 1/4$
Maximum NA = 0.8
$d_{EX} = 26.4$
$L = 1191.307$

| S | r | d | n | |
|---|---|---|---|---|
| 4 | −308.498 | 1.000 | 1 | |
| 5 | 798.586 | 25.527 | 1.50839 | |
| 6 | −348.935 | 1.000 | 1 | |
| 7 | 421.955 | 28.789 | 1.50839 | |
| 8 | −335.489 | 1.000 | 1 | |
| 9 | 281.085 | 17.000 | 1.50839 | |
| 10 | 210.236 | 3.852 | 1 | |
| 11 | 248.819 | 31.665 | 1.50839 | |
| 12 | −312.999 | 1.000 | 1 | |
| 13 | −2000.000 | 12.729 | 1.50839 | |
| 14 | 150.843 | 27.217 | 1 | |
| 15 | −203.928 | 12.000 | 1.50839 | |
| 16 | 167.173 | 26.604 | 1 | |
| 17 | −208.236 | 12.500 | 1.50839 | |
| 18 | 957.666 | 24.946 | 1 | (ASP5) |
| 19 | −147.060 | 18.000 | 1.50839 | |
| 20 | −378.007 | 7.483 | 1 | |
| 21 | −258.912 | 25.237 | 1.50839 | |
| 22 | −168.885 | 1.000 | 1 | |
| 23 | ∞ | 40.270 | 1.50839 | |
| 24 | −266.905 | 1.000 | 1 | |
| 25 | 1909.000 | 44.411 | 1.50839 | |
| 26 | −318.771 | 1.000 | 1 | |
| 27 | 281.823 | 48.046 | 1.50839 | |
| 28 | −2703.904 | 1.000 | 1 | |
| 29 | 173.110 | 46.118 | 1.50839 | |
| 30 | 491.765 | 23.296 | 1 | |
| 31 | 475.493 | 20.366 | 1.50839 | |
| 32 | 120.322 | 46.663 | 1 | |
| 33 | −209.981 | 12.000 | 1.50839 | (ASP1) |
| 34 | 197.000 | 45.464 | 1 | |
| 35 | −114.299 | 12.850 | 1.50839 | |
| 36 | −5000.000 | 11.908 | 1 | |
| 37 | −478.278 | 42.997 | 1.50839 | (ASP2) |
| 38 | −169.870 | 4.260 | 1 | |
| 39 | ∞ | 8.837 | 1 | (Q) |
| 40 | 683.041 | 40.543 | 1.50839 | |
| 41 | −386.391 | 0.000 | 1 | |
| 42 | ∞ | 8.716 | 1 | (AS) |
| 43 | 1378.469 | 47.021 | 1.50839 | |
| 44 | −287.893 | 17.279 | 1 | |
| 45 | −214.067 | 27.250 | 1.50839 | |
| 46 | −277.449 | 10.000 | 1 | |
| 47 | 260.145 | 42.695 | 1.50839 | |
| 48 | 1760.879 | 1.000 | 1 | |
| 49 | 189.250 | 38.807 | 1.50839 | |
| 50 | 444.163 | 1.000 | 1 | |
| 51 | 180.000 | 27.895 | 1.50839 | |
| 52 | 297.607 | 1.000 | 1 | |
| 53 | 155.389 | 32.579 | 1.50839 | |
| 54 | 496.127 | 4.141 | 1 | (ASP3) |
| 55 | 712.002 | 27.982 | 1.50839 | |
| 56 | 65.481 | 4.652 | 1 | |
| 57 | 66.000 | 59.959 | 1.50839 | |
| 58 | 441.381 | (WD) | 1 | |

TABLE 3B

VALUES OF ASPHERICAL COEFFICIENTS

Surface ASP1

$c = -4.76234E-03$
$\kappa = 0.861651$
$A = -7.84820E-09$

TABLE 3B-continued

VALUES OF ASPHERICAL COEFFICIENTS $B = 3.01423E-12$
$C = 9.70754E-17$
$D = 1.62617E-21$
$E = -2.56672E-25$
$F = 1.42862E-29$
Surface ASP2

$c = -2.09084E-03$
$\kappa = 2.804972$
$A = -8.77018E-09$
$B = -4.80478E-13$
$C = -3.02578E-18$
$D = -2.74308E-21$
$E = 2.11317E-25$
$F = -1.37915E-29$
Surface ASP3

$c = 2.01561E-03$
$\kappa = 0$
$A = 5.23214E-10$
$B = 1.19414E-12$
$C = -5.86228E-17$
$D = 1.24893E-21$
$E = 0$
$F = 0$
Surface ASP5

$c = 1.04421E-03$
$\kappa = 0$
$A = -2.65532E-08$
$B = -4.16828E-13$
$C = 5.01741E-18$
$D = -6.52068E-21$
$E = 7.82794E-25$
$F = -6.18178E-29$

TABLE 3C

PARAMETERS AND DESIGN CONDITION VALUES (1) $0.083 \leq d_O/\{L \times (1-NA)\} \leq 0.207$
(2) $f1/L = 0.123$
(3) $-f2/L = 0.047$
(4) $f3/L = 0.104$
(5) $-f4/L = 0.080$
(6) $f5/L = 0.110$
$f1 = 145.982$
$f2 = -56.252$
$f3 = 123.837$
$f4 = -94.933$
$f5 = 131.432$
$L = 1191.307$
$d = 49.380$
$NA = 0.8 \sim 0.5$ As can be seen from aberration plots 7A–7D for Working Example 3 of the present invention, distortion in particular is satisfactorily corrected over the entire large exposure region, and other aberrations are also well corrected with good balance. In addition, even though projection optical system 60 is double-telecentric with a maximum value of the NA=0.8, the effects of vignetting are small, and the various aberrations remain satisfactorily corrected even if the NA is greatly changed. The present Working Example can be applied to a slit-like (rectangular) shape exposure field (e.g., 26 mm×8 mm or 26 mm×5 mm).

WORKING EXAMPLE 4

With reference to FIG. 8, projection optical system 80 represents Working Example 4 of the present invention, and has essentially the same basic configuration of lens groups as projection optical system 20 of FIG. 2, including the locations of aspherical surfaces ASP1–APS3. Projection optical system 60 further includes an aspherical surface ASP6 is arranged in third lens group G1.

TABLE 4A

DESIGN SPECIFICATIONS FOR WORKING EXAMPLE 4

$D0 = 56.195$
$WD = 8.547$
$|\beta| = 1/4$
Maximum NA = 0.8
$d_{EX} = 26.4$
$L = 1189.851$

| S | r | d | n | |
|---|---|---|---|---|
| 1 | −281.019 | 13.000 | 1.50839 | |
| 2 | 316.929 | 8.609 | 1 | |
| 3 | 2500.000 | 26.225 | 1.50839 | |
| 4 | −303.360 | 1.000 | 1 | |
| 5 | 804.062 | 24.227 | 1.50839 | |
| 6 | −318.842 | 1.000 | 1 | |
| 7 | 354.459 | 29.152 | 1.50839 | |
| 8 | −377.293 | 1.000 | 1 | |
| 9 | 263.543 | 17.000 | 1.50839 | |
| 10 | 199.659 | 6.604 | 1 | |
| 11 | 295.344 | 30.241 | 1.50839 | |
| 12 | −307.153 | 1.074 | 1 | |
| 13 | −2000.000 | 13.052 | 1.50839 | |
| 14 | 152.095 | 25.535 | 1 | |
| 15 | −226.948 | 12.000 | 1.50839 | |
| 16 | 199.970 | 23.919 | 1 | |
| 17 | −200.430 | 12.500 | 1.50839 | |
| 18 | 750.000 | 29.580 | 1 | |
| 19 | −134.929 | 18.000 | 1.50839 | |
| 20 | −423.324 | 6.957 | 1 | |
| 21 | −286.676 | 29.399 | 1.50839 | |
| 22 | −167.682 | 1.000 | 1 | |
| 23 | ∞ | 40.813 | 1.50839 | |
| 24 | −266.938 | 1.000 | 1 | |
| 25 | 3220.051 | 42.890 | 1.50839 | |
| 26 | −317.569 | 1.000 | 1 | |
| 27 | 302.026 | 48.170 | 1.50839 | |
| 28 | −1518.815 | 1.000 | 1 | (ASP6) |
| 29 | 171.737 | 46.214 | 1.50839 | |
| 30 | 481.358 | 20.022 | 1 | |
| 31 | 458.364 | 20.729 | 1.50839 | |
| 32 | 121.840 | 46.884 | 1 | |
| 33 | −203.076 | 12.000 | 1.50839 | (ASP1) |
| 34 | 185.000 | 45.147 | 1 | |
| 35 | −121.196 | 12.850 | 1.50839 | |
| 36 | ∞ | 11.728 | 1 | |
| 37 | −465.519 | 39.959 | 1.50839 | (ASP2) |
| 38 | −170.031 | 4.118 | 1 | |
| 39 | ∞ | 8.882 | 1 | (Q) |
| 40 | 663.260 | 40.673 | 1.50839 | |
| 41 | −392.224 | 0.000 | 1 | |
| 42 | ∞ | 9.244 | 1 | (AS) |
| 43 | 1492.727 | 49.719 | 1.50839 | |
| 44 | −277.593 | 12.757 | 1 | |
| 45 | −214.522 | 27.250 | 1.50839 | |
| 46 | −282.481 | 10.000 | 1 | |
| 47 | 261.717 | 41.243 | 1.50839 | |
| 48 | 1246.120 | 1.000 | 1 | |
| 49 | 188.000 | 39.612 | 1.50839 | |
| 50 | 439.103 | 1.000 | 1 | |
| 51 | 178.000 | 29.125 | 1.50839 | |
| 52 | 307.599 | 1.000 | 1 | |
| 53 | 147.699 | 33.313 | 1.50839 | |
| 54 | 461.089 | 4.088 | 1 | (ASP3) |
| 55 | 612.505 | 24.500 | 1.50839 | |
| 56 | 65.463 | 6.105 | 1 | |
| 57 | 66.000 | 60.000 | 1.50839 | |
| 58 | 373.143 | (WD) | 1 | |

TABLE 4B

VALUES OF ASPHERICAL COEFFICIENTS

Surface ASP1

$c = -4.92426E-03$
$\kappa = 1.140743$
$A = -1.17013E-08$
$B = 2.95847E-12$
$C = 7.22796E-17$
$D = 3.50053E-21$
$E = -4.73158E-25$
$F = 1.77468E-29$ Surface ASP2

$c = -2.14814E-03$
$\kappa = -0.511241$
$A = -2.90908E-09$
$B = -3.82923E-13$
$C = 9.51818E-19$
$D = -1.02058E-21$
$E = 7.38868E-26$
$F = -3.11809E-30$ Surface ASP3

$c = 2.16878E-03$
$\kappa = 0$
$A = 6.88715E-09$
$B = 8.36584E-13$
$C = -4.26325E-17$
$D = 9.02955E-22$
$E = 0$
$F = 0$ Surface ASP6

$c = -6.58408E-04$
$\kappa = 0$
$A = -1.29700E-09$
$B = -2.23515E-14$
$C = 2.71217E-19$
$D = 4.78605E-24$
$E = 0$
$F = 0$

TABLE 4C

PARAMETERS AND DESIGN CONDITION VALUES

(1) $0.084 \leq d_Q/\{L \times (1-NA)\} \leq 0.208$
(2) $f1/L = 0.125$
(3) $-f2/L = 0.047$
(4) $f3/L = 0.103$
(5) $-f4/L = 0.079$
(6) $f5/L = 0.109$
$f1 = 148.857$
$f2 = -55.987$
$f3 = 122.578$
$f4 = -93.819$
$f5 = 130.011$
$L = 1189.851$
$d = 49.554$
$NA = 0.8~0.5$ As can be seen from aberration plots 9A–9D for Working Example 4 of the present invention, distortion in particular is satisfactorily corrected over the entire large exposure region, and other aberrations are also well corrected with good balance. In addition, even though projection optical system 60 is double-telecentric with a maximum value of the NA=0.8, the effects of vignetting are small, and the various aberrations remain satisfactorily corrected even if the NA is greatly changed. The present Working Example can be applied to a slit-like (rectangular) shape exposure field (e.g., 26 mm×8 mm or 26 mm×5 mm).

It will be apparent to one skilled in the art that the abovementioned modes for carrying out the present invention is not limited to a particular wavelength or narrow band centered thereon. For example, the present invention can be applied to an ultraviolet wavelength of λ=248.4 nm (e.g., from a KrF laser), or deep ultraviolet light of λ=193 nm (e.g., from an ArF laser), λ=157 nm (e.g., from an $F_2$ laser), and λ=147 nm (e.g., from a $Kr_2$ laser). In addition, the present invention can be applied to other wavelengths in the ultraviolet region like the g-line (λ=435.8 nm wavelength) and i-line (λ=365.0 nm wavelength) of mercury lamps, the higher harmonics of YAG lasers (e.g., λ=248 nm, 193 nm, or 157 nm) and the like. In addition, other glass types besides quartz, such as fluorite (calcium fluoride, $CaF_2$), barium fluoride ($BaF_2$), lithium fluoride (LiF) and magnesium fluoride ($MgF_2$) can also be used. The embodiments of the present invention were described above in connection with step-and-scan projection exposure apparatus. However, the projection optical system of present invention can be applied to step-and-repeat projection exposure apparatus as well. In this case, the exposure field can use, e.g., a square shape, or rectangular shape inside a circular area of diameter 26.4 mm. In addition, though the projection magnification (lateral magnification) of the above embodiments and Working Examples is a reduction magnification, the present invention can be applied to unit magnification, or enlargement magnification.

Semiconductor Device Manufacturing Method

The present invention includes a method of patterning a workpiece using exposure apparatus 10 of FIG. 1. The method includes the steps of providing a layer of photosensitive material onto workpiece (wafer) W, projecting an image of the pattern of object (reticle) R through projection optical system PL onto workpiece (wafer) W, and developing the photosensitive material on workpiece (wafer) W. An additional step of forming a predetermined circuit pattern on workpiece (wafer) W (e.g., via an etch process) using the post-developed photosensitive material as the mask may also be performed. Such a method results in a high-resolution device circuit pattern on workpiece (wafer) W formed substantially without image distortion.

Figure 10:
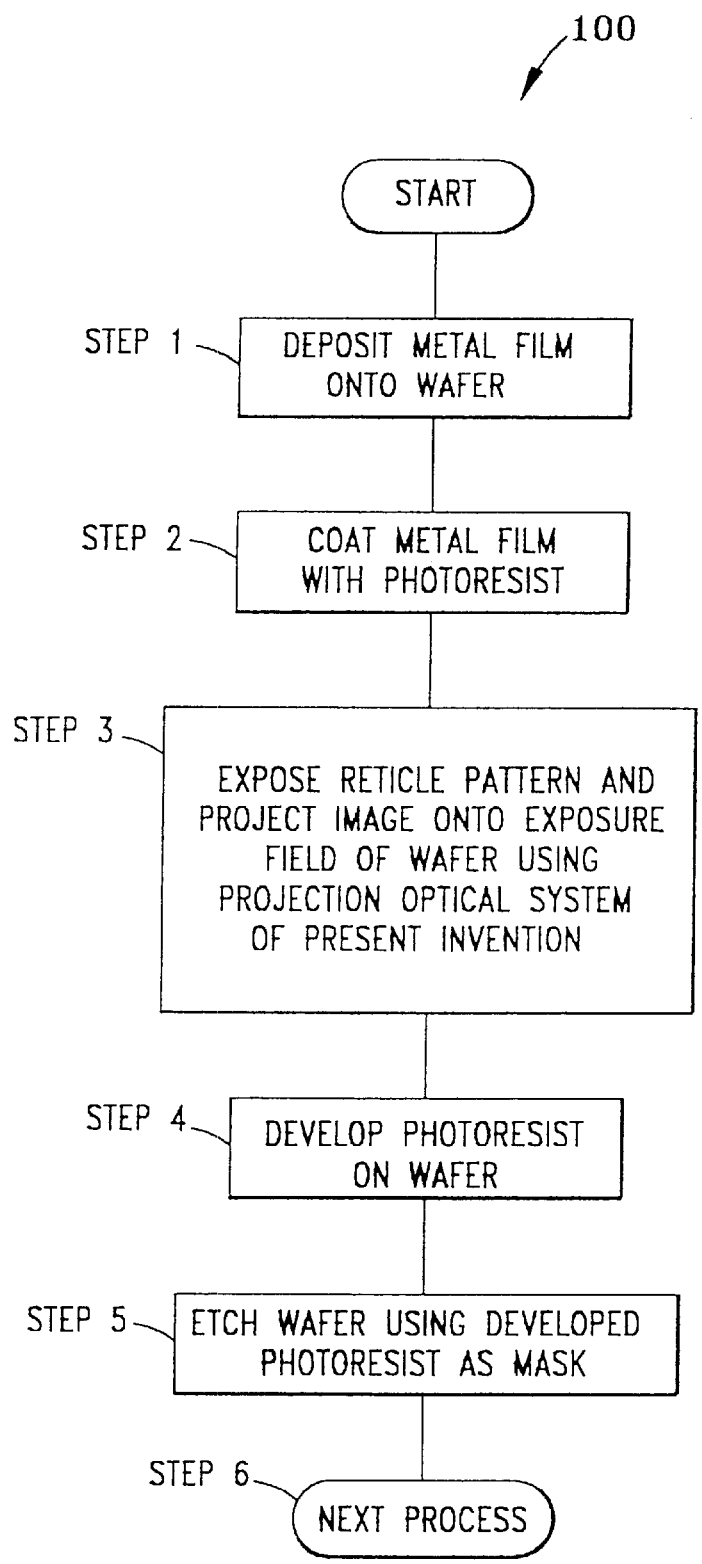
FIG. 10 is a flowchart of a preferred method of manufacturing a semiconductor device patterning a wafer with the exposure apparatus and projection optical system of the present invention.

With reference now also to FIG. 10 and flow chart 100, a method of manufacturing a semiconductor device is now explained. First, in step 1, a metal film is vapor deposited on each wafer in a "lot" (i.e., group) of wafers. In step 2, photoresist is coated on the metal film on each wafer in the lot. Subsequently, in step 3, using projection exposure apparatus 10 of FIG. 1 provided with a projection optical system PL according to the present invention as described above, the image of the pattern (not shown) on object (reticle) R is sequentially exposed and transferred to one or more exposure fields EF on each wafer W in the lot of wafers, through projection optical system PL. Then, in step 4, the photoresist on each wafer in the lot of wafers is developed. Next, in step 5, by etching each wafer W in the lot of wafers using the developed photoresist as the mask, a circuit pattern corresponding to the pattern on reticle R is formed in each exposure field EF on each wafer W in the lot of wafers. Subsequently, in step 6, by further forming additional circuit patterns (e.g., upper-layer circuit patterns) using the next process, semiconductor devices are manufactured.

Since projection optical system PL in the present example is double-telecentric and its NA is large and variable, fine circuit patterns can be stably formed with high resolution on each wafer W, even if there is warpage in reticle R or warpage in each wafer to be exposed. In addition, since exposure region EF of projection optical system PL is large, large devices can be manufactured with high throughput.

Furthermore, it will be understood the present invention is not limited to the abovementioned modes and Working Examples for carrying out the present invention and, within a range that does not deviate from the purport of the present invention, a variety of configurations are obtainable.

What is claimed is:

1. A projection optical system capable of forming an image of an object, comprising, objectwise to imagewise, along an optical axis:

a) a first lens group having positive refractive power;

b) a second lens group having negative refractive power;

c) a third lens group having positive refractive power;

d) a fourth lens group having negative refractive power and a first aspherical surface;

e) a fifth lens group having positive refractive power and an aperture stop;

f) wherein the projection optical system is designed such that paraxial rays travelling parallel to the optical axis imagewise to objectwise intersect the optical axis at a location Q between said fourth lens group and said fifth lens group;

g) at least one of said fourth and fifth lens groups includes a second aspherical surface arranged between said first aspherical surface and said aperture stop;

h) said fifth lens group includes a third aspherical surface arranged imagewise of said aperture stop; and i) wherein the following condition is satisfied:

$$0.01 < d_Q / \{L \times (1-NA)\} < 0.4 \quad (1)$$

wherein the image and the object are separated by a distance L, said location Q and said aperture stop are separated by a distance $d_Q$, and NA is an imagewise numerical aperture of the projection optical system.

2. A projection optical system according to claim 1, wherein said aperture stop has a variable size and is located imagewise of said location Q such that vignetting is minimized when said variable size is changed.

3. A projection optical system according to claim 1, wherein:

a) said first aspherical surface is concave and includes refractive power at a paraxial region and refractive power at a periphery, wherein said refractive power at said periphery is weaker than said refractive power at said paraxial region;

b) said second aspherical surface includes refractive power at a paraxial region and refractive power at a periphery, and is one of:

i) a convex surface, with said refractive power at said periphery weaker than said refractive power at said paraxial region; and ii) a concave surface, with said refractive power at said periphery stronger than said refractive power at said paraxial region; and c) said third aspherical surface includes refractive power at a paraxial region, and refractive power at a periphery, and is one of:

i) a convex surface, with said refractive power at said periphery weaker than said refractive power at said paraxial region; and ii) a concave surface, with said refractive power at said periphery stronger than said refractive power at said paraxial region.

4. A projection optical system according to claim 1, wherein said first lens group has at least one aspherical surface.

5. A projection optical system according to claim 1, wherein said second lens group has at least one aspherical surface.

6. A projection optical system according to claim 1, wherein said third lens group has at least one aspherical surface.

7. A projection optical system according to claim 1, satisfying the following conditions:

$$0.05 < f1/L < 0.5 \quad (2)$$

$$0.02 < -f2/L < 0.2 \quad (3)$$

$$0.04 < f3/L < 0.4 \quad (4)$$

$$0.03 < -f4/L < 0.3 \quad (5)$$

$$0.04 < f5/L < 0.4 \quad (6)$$

wherein f1 through f5 are focal lengths of said first through fifth lens groups, respectively.

8. A projection optical system capable of forming an image of an object, comprising, objectwise to imagewise, along an optical axis:
   a) a first lens group having positive refractive power;
   b) a second lens group having negative refractive power;
   c) a third lens group having positive refractive power;
   d) a fourth lens group having negative refractive power and a first aspherical concave surface with refractive power at a paraxial region and refractive power at a periphery, wherein said refractive power at said periphery is weaker than said refractive power at said paraxial region;
   e) a second aspherical surface arranged imagewise of said first aspherical surface and having refractive power at a paraxial region and refractive power at a periphery, and being one of:
      i) a convex surface, with said refractive power at said periphery weaker than said refractive power at said paraxial region; and
      ii) a concave surface, with said refractive power at said periphery stronger than said refractive power at said paraxial region;
   f) a fifth lens group having positive refractive power, an aperture stop, and a third aspherical surface arranged imagewise of said aperture stop, wherein said third aspherical surface includes a paraxial region, a periphery and refractive power and is one of:
      i) a convex surface, with said refractive power at said periphery weaker than said refractive power at said paraxial region; and
      ii) a concave surface, with said refractive power at said periphery stronger than said refractive power at said paraxial region; and
   g) wherein the projection optical system is designed such that paraxial rays traveling parallel to the optical axis imagewise to objectwise intersect the optical axis at a location Q between said fourth lens group and said fifth lens group.

9. A projection optical system according to claim 8, wherein said first lens group has at least one aspherical surface.

10. A projection optical system according to claim 8, wherein said second lens group has at least one aspherical surface.

11. A projection optical system according to claim 8, wherein said third lens group has a least one aspherical surface.

12. A projection optical system according to claim 8, satisfying the following conditions:

$$0.05 < f1/L < 0.5 \quad (2)$$

$$0.02 < -f2/L < 0.2 \quad (3)$$

$$0.04 < f3/L < 0.4 \quad (4)$$

$$0.03 < -f4/L < 0.3 \quad (5)$$

$$0.04 < f5/L < 0.4 \quad (6)$$

wherein f1 through f5 are focal lengths of said first through fifth lens groups, respectively.

13. An exposure apparatus for imaging a pattern present on a reticle onto a photosensitive workpiece, comprising:
   a) a first stage for supporting the reticle;
   b) an illumination optical system adjacent said first stage for illuminating the reticle;
   c) a second stage for supporting a workpiece; and
   d) a projection optical system arranged between said first stage and said second stage, said projection optical system comprising in order from said first to said second stage:
      i) a first lens group having positive refractive power;
      ii) a second lens group having negative refractive power;
      iii) a third lens group having positive refractive power;
      iv) a fourth lens group having negative refractive power and a first aspherical surface;
      v) a fifth lens group having positive refractive power and an aperture stop;
      vi) wherein the projection optical system is designed such that paraxial rays travelling parallel to the optical axis imagewise to objectwise intersect the optical axis at a location Q between said fourth lens group and said fifth lens group;
      vii) wherein at least one of said fourth and fifth lens groups includes a second aspherical surface arranged between said first aspherical surface in said fourth lens group and said aperture stop;
      viii) wherein said fifth lens group includes a third aspherical surface arranged imagewise of said aperture stop; and
      ix) wherein the following condition is satisfied:

$$0.01 < d_Q/\{L \times (1-NA)\} < 0.4 \quad (1)$$

wherein said image and said workpiece are separated by a distance L, said position Q and said aperture stop are separated by a distance $d_Q$, and NA is an imagewise numerical aperture of the projection optical system.

14. An exposure apparatus according to claim 13, wherein said first stage and said second stage are moveable along a scanning direction, and said projection optical system includes an exposure field having a first dimension orthogonal to said scanning direction and a second dimension along said scanning direction, wherein said first dimension is greater than said second dimension.

15. An exposure apparatus according to claim 14, wherein said first dimension is at least 25 mm.

16. A projection optical system capable of forming an image of an object, comprising, along an optical axis:
   a) a first lens group, arranged in an optical path between the object and the image, having positive refractive power and a plurality of lenses including a negative lens;

b) a second lens group, arranged in the optical path between the first lens group and the image, having negative refractive power and a plurality of negative lenses;

c) a third lens group, arranged in the optical path between the second lens group and the image, having positive refractive power and a plurality of positive lenses;

d) a fourth lens group, arranged in the optical path between the third lens group and the image, having negative refractive power;

e) a fifth lens group, arranged in the optical path between the fourth lens group and the image, having positive refractive power and a plurality of lenses including a negative lens, and having an aperture stop located in said fifth lens group;

f) an imagewise maximum numerical aperture $NA_{MAX}$ of at least 0.8; and g) wherein the number of lenses objectwise of said aperture stop is at least six, and the number of lenses imagewise of said aperture stop is at least four.

17. A projection optical system according to claim 16, further including an exposure field having a dimension of at least 25 mm.

18. A projection optical system according to claim 16, wherein said aperture stop has a variable size such that the projection optical system has a numerical aperture NA satisfying the relation:

$$0.6 \times Na_{max} \leq NA \leq Na_{max}.$$

19. A projection optical system according to claim 16, wherein the optical axis is unfolded.

20. A projection optical system according to claim 16, satisfying the following conditions:

$$0.05 < f1/L < 0.5 \quad (2)$$
$$0.02 < -f2/L < 0.2 \quad (3)$$
$$0.04 < f3/L < 0.4 \quad (4)$$
$$0.03 < -f4/L < 0.3 \quad (5)$$
$$0.04 < f5/L < 0.4 \quad (6)$$

wherein f1 through f5 are focal lengths of said first through fifth lens groups, respectively.

21. A projection optical system according to claim 16, further comprising an aspherical lens surface in any one of the lens groups.

22. A projection optical system capable of forming an image of an object, comprising, along an optical axis:

a) a first lens group, arranged in an optical path between the object and the image, having positive refractive power and a plurality of lenses including a negative lens;

b) a second lens group, arranged in the optical path between the first lens group and the image, having negative refractive power and a plurality of negative lenses;

c) a third lens group, arranged in the optical path between the second lens group and the image, having positive refractive power and a plurality of positive lenses;

d) a fourth lens group, arranged in the optical path between the third lens group and the image, having negative refractive power;

e) a fifth lens group, arranged in the optical path between the fourth lens group and the image, having positive refractive power and a plurality of lenses including a negative lens, and having an aperture stop located in said fifth lens group;

f) an imagewise maximum numerical aperture $NA_{MAX}$ of at least 0.8; and g) said projection optical system further satisfying the following condition:

$$0.01 < d_Q/\{L \times (1-NA)\} < 0.4 \quad (1)$$

wherein said image and said object are separated by a distance L, Q is a position located a distance $d_Q$ from said aperture stop wherein paraxial rays traveling parallel to the optical axis imagewise to objectwise intersect the optical axis, and wherein NA is an imagewise numerical aperture of the projection optical system.

23. A projection optical system having specifications and characteristics as set forth in Tables 1A–1C.

24. A projection optical system having specifications and characteristics as set forth in Tables 2A–2C.

25. A projection optical system having specifications and characteristics as set forth in Tables 3A–3C.

26. A projection optical system having specifications and characteristics as set forth in Tables 4A–4C.

27. An exposure apparatus for imaging a pattern present on a reticle onto a photosensitive workpiece, comprising:

(a) a first stage for supporting the reticle;

(b) an illumination optical system adjacent said first stage for illuminating the reticle;

(c) a second stage for supporting the workpiece; and (d) a projection optical system arranged between said first stage and said second stage, said projection optical system comprising in order from said first to said second stage:

(i) a first lens group having positive refractive power;

(ii) a second lens group having negative refractive power;

(iii) a third lens group having positive refractive power;

(iv) a fourth lens group having negative refractive power and a first aspherical concave surface with a paraxial region, a periphery and refractive power, wherein said refractive power at said periphery is weaker than said refractive power at said paraxial region;

(v) a second aspherical surface arranged imagewise of said first aspherical surface and having a paraxial region, a periphery and refractive power, said second aspherical surface being one of:

(1) a convex surface, with said refractive power at said periphery weaker than said refractive power at said paraxial region; and (2) a concave surface, with said refractive power at said periphery stronger than said refractive power at said paraxial region;

(vi) a fifth lens group having positive refractive power, an aperture stop, and a third aspherical surface with a paraxial region, a periphery and refractive power, said third aspherical surface being one of:

(1) a convex surface, with said refractive power at said periphery weaker then said refractive power at said paraxial region; and (2) a concave surface, with said refractive power at said periphery stronger than said refractive power at said paraxial region; and (vii) wherein the projection optical system is designed such that paraxial rays traveling parallel to the optical axis imagewise to objectwise intersect the optical axis at a location Q between said fourth lens group and said fifth lens group.

28. An exposure apparatus according to claim 27, wherein said first stage and said second stage are movable along a scanning direction, and said projection optical system includes an exposure field having a first dimension orthogonal to said scanning direction, and a second dimension along said scanning direction, wherein said first dimension is greater than said second dimension.

29. A exposure apparatus according to claim 28, wherein at least one of said plurality of lenses includes an aspherical surface.

* * * * *